(12) United States Patent
Yamaguchi et al.

(10) Patent No.: US 10,408,864 B2
(45) Date of Patent: Sep. 10, 2019

(54) VOLTAGE MEASURING APPARATUS, VOLTAGE MEASURING METHOD, VOLTAGE CONTROL APPARATUS, AND VOLTAGE CONTROL METHOD

(71) Applicant: Sumitomo Electric Industries, Ltd., Osaka-shi (JP)

(72) Inventors: Youhei Yamaguchi, Osaka (JP); Tomomi Kataoka, Osaka (JP); Keiichi Kawano, Osaka (JP); Takahiro Matsuura, Osaka (JP); Hiroaki Takechi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 20 days.

(21) Appl. No.: 15/738,371

(22) PCT Filed: Jun. 29, 2016

(86) PCT No.: PCT/JP2016/069327
§ 371 (c)(1),
(2) Date: Dec. 20, 2017

(87) PCT Pub. No.: WO2017/006829
PCT Pub. Date: Jan. 12, 2017

(65) Prior Publication Data
US 2018/0306845 A1 Oct. 25, 2018

(30) Foreign Application Priority Data

Jul. 7, 2015 (JP) .................. 2015-136308
Jul. 7, 2015 (JP) .................. 2015-136316
Apr. 22, 2016 (JP) .................. 2016-085796

(51) Int. Cl.
*H02K 7/00* (2006.01)
*G01R 19/165* (2006.01)
(Continued)

(52) U.S. Cl.
CPC . *G01R 19/16576* (2013.01); *G01R 19/16542* (2013.01); *H01M 10/4264* (2013.01);
(Continued)

(58) Field of Classification Search
CPC ... H02J 7/0016; H02J 7/0018; Y02T 10/7055; Y02E 60/12; H01M 10/441
(Continued)

(56) References Cited

U.S. PATENT DOCUMENTS

2002/0017895 A1* 2/2002 Kawashima .......... H02J 7/0019
320/118
2002/0190692 A1* 12/2002 Marten ................. G06F 1/3203
320/116
(Continued)

FOREIGN PATENT DOCUMENTS

JP 2013-226034 A 10/2013

*Primary Examiner* — Arun C Williams
(74) *Attorney, Agent, or Firm* — Baker Botts LLP; Michael A. Sartori

(57) ABSTRACT

A voltage measuring apparatus that individually measures voltages of n-pieces (2≤n) of power storage elements B(1) to B(n) connected in series includes: first to n-th voltage detecting units that respectively individually measure voltages of the power storage elements; a switching circuit that switches a connection state between the power storage elements and the first to n-th voltage detecting units; a SW control unit that drives the switching circuit; and an operation processing unit. The power storage elements are arranged in order so that potential becomes higher as n increases. The switching circuit includes a capacitor connected in parallel to the power storage element B(1). In the switching circuit, the negative terminals of the power storage elements are connected to a first terminal of the capacitor via respective corresponding first switches. The positive terminals of the power storage elements are connected to a second terminal of the capacitor via respective correspond- (Continued)

ing second switches. A third switch SW3 is interposed between the first voltage detecting unit and the first terminal. When the first switch and the second switch corresponding to the power storage element B(j) (j is any of 1 to n) are respectively switches SWj1 and SWj2, the SW control unit closes the switches SWj1 and SWj2 and opens other first and second switches according to an instruction of the operation processing unit, so that the capacitor is connected in parallel to the power storage element B(j).

19 Claims, 7 Drawing Sheets

(51) Int. Cl.
*H02J 7/02* (2016.01)
*H01M 10/42* (2006.01)
*H02J 7/00* (2006.01)
*H01M 10/44* (2006.01)
*H01M 10/48* (2006.01)
*G01R 31/3835* (2019.01)
*H02J 7/34* (2006.01)

(52) U.S. Cl.
CPC ....... *H01M 10/441* (2013.01); *H01M 10/482* (2013.01); *H02J 7/0016* (2013.01); *H02J 7/0021* (2013.01); *H02J 7/0026* (2013.01); *H02J 7/0047* (2013.01); *H02J 7/02* (2013.01); *G01R 31/3835* (2019.01); *H01M 2010/4271* (2013.01); *H02J 7/345* (2013.01)

(58) Field of Classification Search
USPC ......................................................... 320/118
See application file for complete search history.

(56) References Cited

U.S. PATENT DOCUMENTS

2003/0210017 A1* 11/2003 Tsujii .................... H02J 7/0016
320/166
2004/0051534 A1* 3/2004 Kobayashi ....... G01R 19/16542
324/429

* cited by examiner

VOLTAGE MEASURING APPARATUS, VOLTAGE MEASURING METHOD, VOLTAGE CONTROL APPARATUS, AND VOLTAGE CONTROL METHOD

TECHNICAL FIELD

The present invention relates to a voltage measuring apparatus, a voltage measuring method, a voltage control apparatus, and a voltage control method.

The present application claims the benefit of priority to Japanese Patent Application No. 2015-136308 filed on Jul. 7, 2015, Japanese Patent Application No. 2015-136316 filed on Jul. 7, 2015, and Japanese Patent Application No. 2016-085796 filed on Apr. 22, 2016, the disclosure of which is hereby incorporated by reference in its entirety.

BACKGROUND ART

Most of power storage modules include a plurality of power storage elements connected in series. Even though the plurality of power storage elements are of the same type, they are not identical to each other in characteristics, and have their own unique characteristics. This is attributed to inevitable factors such as variations in conditions during manufacture and the difference in the rate of deterioration. Accordingly, for example, the power storage element being the smallest in capacity among the plurality of power storage elements connected in series tends to be overcharged or overdischarged. When overcharge or overdischarge of a power storage element repeatedly occurs, the power storage element further deteriorates, impairing the stability of the power storage module.

Under the circumstances, there is a known system which regulates the voltage for each of a plurality of power storage elements to fall within a range from an operation-guaranteed lower limit voltage to an operation-guaranteed upper limit voltage. For example, Patent Literature 1 proposes control of equalizing voltages of a plurality of power storage elements by measuring the voltage for each of the plurality of power storage elements, and selectively discharging a high-voltage power storage element.

CITATION LIST

Patent Literature

Patent Literature 1: Japanese Unexamined Patent Publication No. 2013-226034

SUMMARY OF INVENTION

A voltage measuring apparatus of the present disclosure individually measures voltages of n-pieces ($2 \leq n$) of power storage elements $B(1)$ to $B(n)$ connected in series, the voltage measuring apparatus includes:

first to n-th voltage detecting units respectively individually measuring voltages of the power storage elements $B(1)$ to $B(n)$;

a switching circuit that switches a connection state between the power storage elements $B(1)$ to $B(n)$ and the first to n-th voltage detecting units;

a SW control unit that drives the switching circuit; and an operation processing unit that communicates with the first to n-th voltage detecting units and the SW control unit, wherein the power storage elements $B(1)$ to $B(n)$ are arranged in order so that potential becomes higher as n increases, the switching circuit includes a capacitor connected in parallel to the power storage element $B(1)$, wherein, in the switching circuit, negative terminals of the power storage elements $B(1)$ to $B(n)$ are connected to a first terminal of the capacitor via respective corresponding first switches, positive terminals of the power storage elements $B(1)$ to $B(n)$ are connected to a second terminal of the capacitor via respective corresponding second switches, a third switch SW3 is interposed between the first voltage detecting unit and the first terminal of the capacitor, when the first switch and the second switch corresponding to the power storage element $B(j)$ (j is an integer selected from 1 to n) are respectively switches SWj1 and SWj2, according to an instruction of the operation processing unit, the SW control unit closes the switches SWj1 and SWj2 and opens other ones of the first switches and the second switches, so that the capacitor is connected in parallel to the power storage element $B(j)$.

A voltage measuring method of the present disclosure is a method of individually measuring voltages of the power storage elements $B(1)$ to $B(n)$ using the voltage measuring apparatus, the method includes the steps of:

(i) measuring, by the first to n-th voltage detecting units, voltages of the power storage elements $B(1)$ to $B(n)$ in a normal mode where switches SW3, SW11 and SW12 are closed and other ones of the first switches and the second switches are open;

(ii) opening the switches SW11 and SW12 to cancel the normal mode, and opening the switch SW3, thereafter closing switches SWj1 and SWj2 (j is an integer selected from 2 to n), to cause the capacitor to read a voltage of the power storage element $B(j)$;

(iii) after causing the capacitor to read the voltage of the power storage element $B(j)$, opening the switches SWj1 and SWj2;

(iv) after opening the switches SWj1 and SWj2, closing the switch SW3 and measuring, by the first voltage detecting unit, the voltage of the capacitor having read the voltage of the power storage element $B(j)$;

(v) after measuring the voltage of the capacitor by the first voltage detecting unit, closing the switches SW12 and SW21 so as to discharge the capacitor; and (vi) correcting a measured value measured by the j-th voltage detecting unit based on the measured voltage value of the capacitor measured by the first voltage detecting unit.

A voltage control apparatus of the present disclosure includes:

a voltage measuring unit that includes first to n-th voltage detecting units that respectively individually measure voltages of n-pieces ($2 \leq n$) of power storage elements $B(1)$ to $B(n)$ connected in series;

a switching circuit that switches a connection state between the power storage elements $B(1)$ to $B(n)$ and the first to n-th voltage detecting units;

a SW control unit that drives the switching circuit; and an operation processing unit that communicates with the first to n-th voltage detecting units and the SW control unit, wherein the power storage elements $B(1)$ to $B(n)$ are arranged in order so that potential becomes higher as n increases, the voltage measuring unit includes terminals $T(1)$ to $T(n)$ for receiving potential at negative terminals of the power storage elements B(1) to B(n), and a terminal T(n+1) for receiving potential at a positive terminal of the power storage element B(n), the switching circuit includes:

lines L(1) to L(n+1) that respectively connect the negative terminals of the power storage elements B(1) to B(n) and the positive terminal of the power storage element B(n) to the terminals T(1) to T(n+1);

bypass lines BL1(1) to BL1($n$) that respectively connect the line L(1) to the lines L(2) to L(n+1); and bypass lines BL2(2) to BL2($n$) that respectively connect the line L(2) to the lines L(3) to L(n+1), wherein the bypass lines BL1(1) to BL1($n$) respectively have first switches SW1(1) to SW1($n$), resistors R being respectively connected in series to the first switches SW1(1) to SW1($n$), the bypass lines BL2(2) to BL2($n$) respectively have second switches SW2(2) to SW2($n$), resistors R being respectively connected in series to the second switches SW2(2) to SW2($n$), the line L(1) has a third switch SW3 on the negative terminal side relative to every connection point with the bypass lines BL1(1) to BL1($n$), the line L(2) has a fourth switch SW4 between a connection point with the bypass line BL1(1) and every connection point with the bypass lines BL2(2) to BL2($n$), and the line L(3) has a fifth switch SW5 on the negative terminal side relative to a connection point with the bypass line BL1(2) and a connection point with the bypass line BL2(2).

A voltage control method of the present disclosure includes a step of equalizing voltages of the power storage elements B(1) to B(n) using the voltage control apparatus, wherein the SW control unit has a function of setting all the switches to a mode selected out of a plurality of candidate modes, the plurality of candidate modes include a normal mode, a first equalization mode, and a second equalization mode, in the normal mode, the switches SW3 to SW5 are closed and other ones of the switches are opened, in the first equalization mode, all the switches are controlled so that at least one of the power storage elements B(1) to B(n) is discharged by a first current, in the second equalization mode, all the switches are controlled so that at least one of the power storage elements B(1) to B(n) is discharged by a second current, a circuit through which the first current flows includes a resistance value corresponding to one piece of the resistor R, a circuit through which the second current flows includes a resistance value corresponding to two pieces of the resistors R, the voltage control method comprising the steps of:

(i) individually measuring voltages of the power storage elements B(1) to B(n) by the voltage measuring unit;

(ii) setting an equalization target voltage Vm based on the measured values measured by the voltage measuring unit; and (iii) discharging at least one of the power storage elements B(1) to B(n) based on the equalization target voltage Vm in the first equalization mode or the second equalization mode.

DESCRIPTION OF EMBODIMENTS

Figure 1:
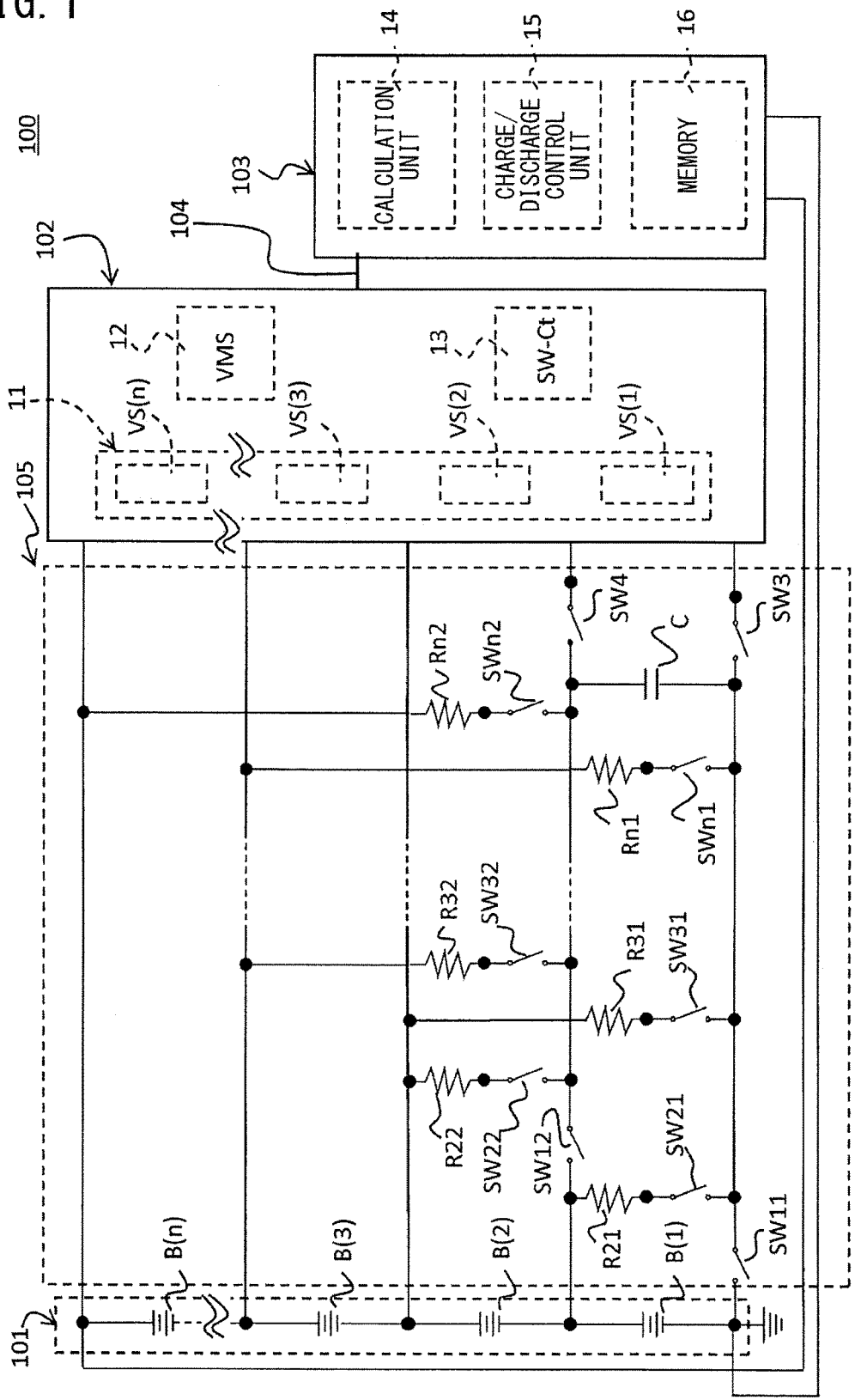
FIG. 1 is a circuit configuration diagram of an exemplary voltage measuring apparatus (power supply apparatus) according to one embodiment of the present invention.

Problems to be Solved by the Present Disclosure

In measuring the voltage for each of a plurality of power storage elements connected in series, a plurality of voltage measuring terminals are used in general. On the other hand, because of variations in an error range among the measuring terminals, high-accuracy measurement is hardly achieved.

Further, since voltages of the plurality of power storage elements connected in series are accumulated on the positive terminal side of a power storage module, the positive terminal side is at a high potential. When the voltage of a power storage element at a high potential is input to a measuring terminal as it is, the voltage may exceed the withstand voltage of components that structure the voltage measuring apparatus. Accordingly, the voltage of a power storage element at a high potential is lowered using a level shifting circuit before being measured. Such an intervention of the level shifting circuit also causes errors in the measured values of the voltage. On the other hand, the voltage of a power storage element on the negative terminal side of the power storage module is measured without the level shifting circuit. This further increases variations in the measured values.

Meanwhile, equalization of voltage is normally performed by allowing current to flow through resistors respectively connected in parallel to a plurality of power storage elements, so that a high-voltage power storage element is discharged. Hence, every time the equalization operation is performed, current always flows through the identical resistor. In this case, it is difficult to largely change the current that is caused to flow in equalization. On the other hand, there is the need for changing the current value for equalization depending on the use status of the power storage module. For example, when time is not demanding, it is desirable to cause current to flow through a greater number of resistors, so that equalization is performed under the moderate conditions with the reduced current value.

Effect of the Present Disclosure

According to the present disclosure, in a power storage module that includes n-pieces (2≤n) of power storage elements connected in series, voltages of the plurality of power storage elements can be individually and highly accurately measured.

According to the present disclosure, in a power storage module that includes n-pieces (2≤n) of power storage elements connected in series, in equalizing voltages among the plurality of power storage elements, the current value can be changed as appropriate depending on the situation.

Description of Embodiments of the Invention

Firstly, the contents of the embodiments of the invention will be listed and described.

[1] A voltage measuring apparatus for a power storage module according to the present embodiment has a function of individually measuring voltages of n-pieces (2≤n) of power storage elements B(1) to B(n) connected in series. The voltage measuring apparatus includes: first to n-th voltage detecting units that respectively individually measure voltages of the power storage elements B(1) to B(n); a switching circuit that switches a connection state between the power storage elements B(1) to B(n) and the first to n-th voltage detecting units; a SW control unit that drives the switching circuit; and an operation processing unit that communicates with the first to n-th voltage detecting units and the SW control unit. The power storage elements B(1) to B(n) are arranged in order so that potential becomes higher as n increases. The switching circuit includes a capacitor connected in parallel to the power storage element B(1). In the switching circuit, the negative terminals of the power storage elements B(1) to B(n) are connected to the first terminal (−) of the capacitor via respective corresponding first switches (−). On the other hand, the positive terminals of the power storage elements B(1) to B(n) are connected to the second terminal (+) of the capacitor via respective corresponding second switches (+).

Between the first voltage detecting unit and the first terminal (−) of the capacitor, a third switch SW3 is interposed. Thus, when a power storage element B(j) (j is an integer selected from 2 to n) is connected in parallel to the capacitor, the positive terminal of a power storage element B(j−1) is prevented from being connected to ground (GND) thereby short-circuited.

Further, between the first voltage detecting unit and the second terminal (+) of the capacitor, a fourth switch SW4 may be interposed. Thus, when the power storage element B(j) (j is an integer selected from 2 to n) is connected in parallel to the capacitor, the first voltage detecting unit is prevented from receiving high voltage. Hence, the first voltage detecting unit is prevented from receiving voltage exceeding the voltage withstanding limit. Further, the withstand voltage of the first voltage detecting unit can be set to a relatively low value.

Assuming that first switch (−) and the second switch (+) corresponding to a power storage element B(j) (j is an integer selected from 1 to n) are a switch SWj1 and a switch SWj2, respectively, the voltage measuring apparatus closes the switch SWj1 and the switch SWj2 and opens other first switches (−) and second switches (+), so that the capacitor is connected in parallel to the power storage element B(j). The opening/closing of the switches or driving of the switching circuit is executed by the SW control unit which communicates with the operation processing unit.

The voltage measuring apparatus is capable of causing the voltage of any power storage element B(j) that structures the power storage module to be read by an identical capacitor. On the other hand, the first voltage detecting unit constantly measures the voltage between the first terminal (−) and the second terminal (+) of the capacitor. Thus, it becomes possible to measure voltages of all the power storage elements with an identical measuring terminal included in the first voltage detecting unit. The measured values measured in this manner are less prone to vary because a separate measuring terminal is not used.

Out of the first to n-th voltage detecting units, the potential input to the first voltage detecting unit is the lowest, and the potential input to the n-th voltage detecting unit is the highest. Accordingly, the first voltage detecting unit can always receive the voltage of the power storage element without the intervention of a level shifting circuit. This simultaneously solves the errors in the measured values attributed to the intervention of a level shifting circuit.

In order to connect the capacitor in parallel to an arbitrary power storage element B(j), for example, out of the first switches (−), the switch SW11 is disposed so as to be nearest in terms of potential to the negative terminal of the power storage element B(1). Further, out of the second switches (+), the switch SW12 is disposed so as to be nearest in terms of potential to the positive terminal of the power storage element B(1). At this time, the switch SW21 is arranged so as to be connected in parallel to the power storage element B(1) and also in parallel to the switch SW12.

[2] The voltage measuring apparatus has a function of sequentially performing operations in which: (i) the SW control unit closes switches SW3, SW11 and SW12 and opens other ones of the first switches and the second switches, so as to set the switching circuit to a normal mode, and the first to n-th voltage detecting units measure the voltages of the power storage elements B(1) to B(n) in the normal mode; (ii) the SW control unit opens the switches SW11 and SW12 so as to cancel the normal mode, the SW control unit opening the switch SW3 and thereafter closing switches SWj1 and SWj2 (j is an integer selected from 2 to n), to cause the capacitor to read the voltage of the power storage element B(j); (iii) after causing the capacitor to read the voltage of the power storage element B(j), the SW control unit opens the switches SWj1 and SWj2; (iv) after opening the switches SWj1 and SWj2, the SW control unit closes the switch SW3, and the first voltage detecting unit measures the voltage of the capacitor having read the voltage of the power storage element B(j); (v) after the first voltage detecting unit has measured the voltage of the capacitor, the SW control unit closes the switches SW12 and SW21 so as to discharge the capacitor; and (vi) the operation processing unit corrects a measured value measured by a j-th voltage detecting unit, based on the measured voltage value of the capacitor measured by the first voltage detecting unit.

[3] The voltage measuring apparatus desirably has a function of sequentially performing, before the operation in which the switches SWj1 and SWj2 (j is an integer selected from 2 to n) are closed to cause the capacitor to read the voltage of the power storage element B(j), operations in which: (a) after closing the switches SW12 and SW21, the SW control unit opens the switches SW12 and SW21; (b) the SW control unit closes the switch SW3, and the first voltage detecting unit measures a voltage of the capacitor; (c) the voltage of the capacitor measured in the operation (b) is compared against a threshold value, and when the voltage of the capacitor is equal to or greater than the threshold value, the operation processing unit detects abnormality of the switch SW11; (d) when the switch SW11 is normal (that is, when abnormality of the switch SW11 is not detected), the SW control unit closes the switch SW11, and the first voltage detecting unit measures a voltage of the capacitor; and (e)

the voltage of the capacitor measured in the operation (d) is compared against the threshold value, and when the voltage of the capacitor is equal to or greater than the threshold value, the operation processing unit detects abnormality of the switch SW12.

The operations (a) to (e) are performed in order to check whether or not the switching circuit (herein, the switches SW11 and SW12) has been failed. When the switches SW11 and SW12 are fixed in the closed state (ON state) due to failure, in closing the switches SWj1 and SWj2 to cause the capacitor to read the voltage of the power storage element B(j), the power storage elements B(j) and B(1) are connected in parallel, which makes it difficult to accurately measure the voltage. In particular, assuming that no resistors are connected in series to the switches SWj1 and SWj2, the power storage elements B(j) and B(1) being high in potential may be short-circuited. Accordingly, it is desirable to previously check whether or not the switches SW11 and SW12 have been failed. Assuming that the switch SW11 is fixed in the closed state due to failure, in operation (a), the capacitor cannot be discharged after the switches SW12 and SW21 are closed. Then, in operation (b), the voltage of the power storage element B(1) is detected as the voltage of the capacitor. On the other hand, when the switch SW11 is normal, in operation (b), the voltage of the discharged capacitor (for example, the voltage close to 0 V) is detected. Hence, in operation (c), whether or not the switch SW11 has been failed can be detected based on the detected voltage.

Further, when the SW12 is fixed in the closed state due to failure and the switch SW11 is normal, the voltage of the power storage element B(1) is detected by the first voltage detecting unit when the switch SW11 is closed in operation (d). Hence, the failure of the switch SW12 is also detected in operation (e).

Here, the threshold value of the voltage against which the voltage of the capacitor is compared may be set with reference to a previously measured voltage V1 of the power storage element B(1), or may be set with reference to an overdischarge voltage V1' of the power storage element B(1). Normally, the voltage of the power storage element B(1) is maintained to be higher than the overdischarge voltage. Hence, when the voltage less than the overdischarge voltage V1' of the power storage element B(1) is detected as the voltage of the capacitor in operation (b) or (d), it can be regarded that the switches SW12 and SW21 are normal. On the other hand, normally, since the voltage of the capacitor quickly attains zero when the capacitor is discharged, the threshold value should be set around 0 V. That is, the threshold value Va of the voltage should be set so as to satisfy 0≤Va<V1 or 0≤Va<V1'.

[4] The switching circuit of the voltage measuring apparatus preferably further includes resistors at least that are respectively connected in series to the first switches (−) and the second switches (+) other than the switches SW11 and SW12. Such resistors can serve to consume part of the electric energy stored in the power storage elements in the control of equalizing voltages. Here, the operation processing unit may further include a calculation unit that calculates an equalization target voltage for the voltages of the power storage elements B(1) to B(n) based on the measured voltage values of the power storage elements B(1) to B(n), and a charge/discharge control unit that individually charges or discharges the power storage elements B(1) to B(n) based on the equalization target voltage. In the discharging, current flows through the resistors, and part of the electric energy stored in the power storage element is consumed.

As used herein, the equalization is a process of balancing variations in voltages as much as possible among the power storage elements B(1) to B(n) by individually discharging or charging at least part of the power storage elements B(1) to B(n). The balanced voltages are the equalized voltages, and the target value thereof is the equalization target voltage.

[5] Between the first voltage detecting unit and the second terminal of the capacitor, a fourth switch SW4 that is opened and closed with the third switch may be interposed. The third switch and the fourth switch open and close in synchronization with each other. That is, control is exerted so that the fourth switch also opens when the third switch opens, and so that the fourth switch also closes when the third switch closes.

[6] A voltage measuring method according to the present embodiment is a method of individually measuring voltages of the power storage elements B(1) to B(n) using the voltage measuring apparatus, and includes the steps of; (i) measuring, by the first to n-th voltage detecting units, voltages of the power storage elements B(1) to B(n) in a normal mode where switches SW3, SW11, and SW12 are closed and other ones of the first switches (−) and the second switches (+) are open; and (ii) opening the switches SW11 and SW12 to cancel the normal mode, and further opening the switch SW3 to transit to a correction mode, thereafter closing the switches SWj1 and SWj2 (j is an integer selected from 2 to n) to cause the capacitor to read a voltage of the power storage element B(j).

The correction mode further includes the steps of; (iii) after causing the capacitor to read the voltage of the power storage element B(j), opening the switches SWj1 and SWj2; (iv) after opening the switches SWj1 and SWj2, closing the switch SW3 and measuring, by the first voltage detecting unit, the voltage of the capacitor having read the voltage of the power storage element B(j); (v) after measuring the voltage of the capacitor by the first voltage detecting unit, closing the switches SW12 and SW21 so as to discharge the capacitor; and (vi) correcting a measured value measured by a j-th voltage detecting unit based on the measured voltage value of the capacitor measured by the first voltage detecting unit. Note that, the order of executing steps (v) and (vi) is not specified.

According to the voltage measuring method, in the normal mode, voltage measurement by the first to n-th voltage detecting units is carried out. At proper timing, control transits to the correction mode, where voltage measurement via the capacitor is carried out. Thus, the measured values obtained by the first to n-th voltage detecting units can be corrected using the measured voltage value of the capacitor at proper timing.

[7] After step (v) or (vi), when control is to return to the normal mode, the switch SW21 should be opened and the switch SW11 should be closed. Further, when correction of other power storage element B(j) is to be subsequently performed, the switch SW21 should be opened and control should return to step (ii). Further, when correction of the power storage element B(2) is to be subsequently performed, control should return to step (ii) with the switch SW21 maintained in the closed state.

[8] The voltage measuring method preferably includes the steps of, before the step of closing the switches SWj1 and SWj2 (j is an integer selected from 2 to n) to cause the capacitor to read the voltage of the power storage element B(j): (a) closing the switches SW12 and SW21 and thereafter opening the switches SW12 and SW21; (b) after the step (a), closing the switch SW3 and measuring a voltage of the capacitor by the first voltage detecting unit; (c) comparing the voltage of the capacitor measured in the step (b) against a threshold value, and detecting abnormality of the switch SW11 when the voltage of the capacitor is equal to or greater than the threshold value; (d) when the switch SW11 is normal, closing the switch SW11 and measuring a voltage of the capacitor by the first voltage detecting unit; and (e) when the voltage of the capacitor measured in the step (d) is equal to or greater than the threshold value, detecting abnormality of the switch SW12.

Next, the contents of other embodiments will be listed and described.

[9] A voltage control apparatus according to the present embodiment includes: a voltage measuring unit that includes first to n-th voltage detecting units that respectively individually measure voltages of n-pieces (2≤n) of power storage elements B(1) to B(n) connected in series; a switching circuit that switches a connection state between the power storage elements B(1) to B(n) and the first to n-th voltage detecting units; a SW control unit that drives the switching circuit; and an operation processing unit that communicates with the first to n-th voltage detecting units and the SW control unit. The power storage elements B(1) to B(n) structure a power storage module and are arranged in order so that potential becomes higher as n increases.

The voltage measuring unit that structures the voltage control apparatus includes terminals T(1) to T(n) for receiving potential at negative terminals of the power storage elements B(1) to B(n), and a terminal T(n+1) for receiving potential at a positive terminal of the power storage element B(n).

The potential at the negative terminals of the power storage elements B(2) to B(n) is substantially identical to the potential at the positive terminal of adjacent one of the power storage elements. On the other hand, a minor difference may occur between the potential at the positive terminal of a power storage element B(i) and the potential at the negative terminal of a power storage element B(i+1) due to intervention of a low-resistance component between the power storage elements B(i) and B(i+1). In such a case also, if the difference is minor and does not largely influence the voltage control, the potential at the positive terminal of the power storage element B(i) and the potential at the negative terminal of the power storage element B(i+1) may be regarded to be substantially identical to each other. Further, the potential at the negative terminals and positive terminals received at the terminals T(1) to T(n+1) should substantially reflect the potential at corresponding electrode terminals.

The switching circuit that structures the voltage control apparatus includes lines L(1) to L(n+1) that respectively connect the negative terminals of the power storage elements B(1) to B(n) and the positive terminal of the power storage element B(n) to the terminals T(1) to T(n+1). Further, the switching circuit includes bypass lines BL1(1) to BL1(n) that respectively connect the line L(1) to the lines L(2) to L(n+1). Further, the switching circuit includes bypass lines BL2(2) to BL2(n) that respectively connect the line L(2) to the lines L(3) to L(n+1).

In other words, the switching circuit includes lines BL1(1) to BL1(n) that serves as bypass lines between the terminal T(1) and the terminals T(2) to T(n+1), and lines BL2(2) to BL2(n) that serves as bypass lines between the terminal T(2) and the terminals T(3) to T(n+1).

As used herein, the "line" or the "bypass line" refers to a conductive path that establishes electrical connection between a point in a circuit and other point in the circuit. On any line, a switch capable of disconnecting or recovering the electrical connection may be present.

The bypass lines BL1(1) to BL1(n) respectively have first switches SW1(1) to SW1(n). Resistors R are respectively connected in series to the first switches SW1(1) to SW1(n). Similarly, the bypass lines BL2(2) to BL2(n) respectively have second switches SW2(2) to SW2(n). Resistors R are respectively connected in series to the second switches SW2(2) to SW2(n).

While the plurality of resistors R are desirably identical to each other in resistance value, a slight difference may be tolerated. However, in view of easier and accurate voltage control, the difference between the maximum value and the minimum value among the plurality of resistors R is desirably 5% as great as the minimum value or smaller. In this case, the resistance values among the plurality of resistors R may be regarded to be substantially identical.

The line L(1) has a third switch SW3 on a side of the negative terminal of the power storage element B(1) relative to every connection point with the bypass lines BL1(1) to BL1(n). The line L(2) has a fourth switch SW4 between the connection point with the bypass line BL1(1) and every connection point with the bypass lines BL2(2) to BL2(n). The line L(3) has a fifth switch SW5 on the side of the negative terminal of the power storage element B(3) relative to the connection point with the bypass line BL1(2) and the connection point with the bypass line BL2(2).

In other words, connection between the negative terminal of the power storage element B(1) and the bypass lines BL1(1) to BL1(n) is turned ON/OFF by the third switch. Connection between the bypass line BL1(1) and the bypass lines BL2(2) to BL2(n) is turned ON/OFF by the fourth switch. Connection between the negative terminal of the power storage element B(3) and the bypass lines BL1(2) and BL2(2) is turned ON/OFF by the fifth switch.

As described above, by disposing a plurality of switches capable of disconnecting and recovering electrical connection and disposing a plurality of resistors R, at least two discharge paths in equalizing voltages among a plurality of power storage elements are formed, making it possible to change the current value depending on the situation.

[10] As described above, in order to change the current value depending on the situation, the SW control unit has, for example, a function of setting all the switches to a mode selected out of a plurality of candidate modes. Here, a plurality of candidate modes include a normal mode, a first equalization mode, and a second equalization mode.

According to an instruction of the operation processing unit, in the normal mode, the SW control unit closes the switches SW3 to SW5 to be in the ON state (conductive state), and opens other ones of the switches to be in the OFF state (non-conductive state). Thus, the power storage elements B(1) to B(n) are respectively connected to the first to n-th voltage detecting units, and the voltages of the power storage elements B(1) to B(n) are individually measured. That is, the negative terminals of the power storage elements B(1) to B(n) are respectively connected to the terminals T(1) to T(n), and the positive terminal of the power storage element B(n) is connected to the terminal T(n+1). Here, the positive terminals of the power storage elements B(1) to B(n−1) are respectively connected to the terminals T(2) to T(n).

In the first equalization mode, the SW control unit controls all the switches so that at least one of the power storage elements B(1) to B(n) is discharged by a first current. In the second equalization mode, the SW control unit controls all the switches so that at least one of the power storage elements B(1) to B(n) is discharged by a second current. Note that, the circuit through which the first current flows has a resistance value corresponding to one piece of resistor R, and the circuit through which the second current flows has a resistance value corresponding to two pieces of resistors R.

Specifically, when the power storage element B(1) is discharged in the first equalization mode, the switches SW1(1) and SW3 are closed, and other switches are opened. In the case where the power storage element B(1) is discharged in the second equalization mode, the switches SW3, SW4, SW1(2), and SW2(2) are closed, and other switches are opened.

In the case where the power storage element B(2) is discharged in the first equalization mode, the switches SW4, SW5, and SW2(2) are closed, and other switches are opened. In the case where the power storage element B(2) is discharged in the second equalization mode, the switches SW5, SW1(1), and SW1(2) are closed, and other switches are opened.

In the case where the power storage element B(i) (i is an integer selected from 3 to n) is discharged in the first equalization mode, the switches SW1(i−1), SW1(i), SW2(i), and SW2(i−1) are closed, and other switches are opened. In the case where the power storage element B(i) is discharged in the second equalization mode, the switches SW1(i−1) and SW1(i) or the switches SW2(i) and SW2(i−1) are closed, and other switches are opened.

[11] As described above, in the normal mode, the power storage elements B(1) to B(n) have their voltages respectively measured by the first to n-th voltage detecting units. The voltages are equalized based on the measured values. Accordingly, the operation processing unit includes a calculation unit that calculates an equalization target voltage Vm for the voltages of the power storage elements B(1) to B(n) based on the measured voltage values of the power storage elements B(1) to B(n). Based on the equalization target voltage Vm calculated by the calculation unit, the SW control unit sets at least one of the power storage elements B(1) to B(n) to the first equalization mode or the second equalization mode.

[12] The switching circuit preferably further includes a capacitor connected in parallel to the power storage element B(1). The negative terminal of the power storage element B(1) is connected to the first terminal of the capacitor, and the positive terminal of the power storage element B(1) is connected to the second terminal of the capacitor. Here, a plurality of candidate modes include a correction mode, and the SW control unit can select the correction mode. In the correction mode, the SW control unit controls the switches so that the capacitor is connected in parallel to one of the power storage elements B(2) to B(n). The voltage of the capacitor is constantly measured by the first voltage detecting unit. Thus, the operation processing unit can correct the measured values measured in the normal mode based on the measured voltage value of the capacitor measured by the first voltage detecting unit.

Note that, a sixth switch SW6 is interposed between the terminal T(1) and the first terminal of the capacitor. Thus, in connecting the power storage element B(j) (j is an integer selected from 2 to n) in parallel to the capacitor, it becomes possible to prevent the positive terminal of the power storage element B(j−1) from being connected to ground (GND) and short-circuited. Here, the line L(1) preferably has the connection point with the first terminal of the capacitor on the terminal T(1) side relative to every connection point with the bypass lines BL1(1) to BL1(n).

Further, between the terminal T(2) and the second terminal of the capacitor, a seventh switch SW7 that is opened and closed in synchronization with the sixth switch SW6 may be interposed. This prevents application of high voltage to the first voltage detecting unit in connecting the power storage element B(j) (j is an integer selected from 2 to n) in parallel to the capacitor. Hence, it becomes possible to avoid the situation where any voltage exceeding the withstand voltage limit is applied to the first voltage detecting unit. Further, the withstand voltage of the first voltage detecting unit can be set to a relatively low value. Here, the line L(2) preferably has the connection point with the second terminal of the capacitor on the terminal T(2) side relative to every connection point of the bypass lines BL2(2) to BL2(n).

Note that, the voltage control apparatus is capable of causing an identical capacitor to read the voltage of an arbitrary power storage element structuring the power storage module. The voltage of the capacitor is constantly measured by an identical measuring terminal that the first voltage detecting unit includes. Accordingly, by virtue of the measuring terminal being identical, the measured value is less prone to vary. Further, of the potentials input to the first to n-th voltage detecting units, the potential input to the first voltage detecting unit is the lowest. Accordingly, the first voltage detecting unit can constantly receive the voltage of the power storage element without intervention of the level shifting circuit. This simultaneously solves errors in the measured values attributed to intervention of the level shifting circuit.

As used herein, the equalization is a process of balancing variations in voltages as much as possible among the power storage elements B(1) to B(n) by individually discharging or charging at least part of the power storage elements B(1) to B(n). The balanced voltages are the equalized voltages, and the target value thereof is the equalization target voltage.

[13] A seventh switch SW7 may be further provided between the terminal T(2) and the second terminal of the capacitor. The sixth switch and the seventh switch open and close in synchronization with each other. That is, control is exerted so that the seventh switch also opens when the sixth switch opens, and the seventh switch also closes when the sixth switch closes.

[14] Next, a voltage control method according to the present embodiment includes a step of equalizing voltages of the power storage elements B(1) to B(n) using the voltage control apparatus. Specifically, the SW control unit sets all the switches to be in a predetermined mode selected out of a plurality of candidate modes. The plurality of candidate modes include a normal mode, a first equalization mode, and a second equalization mode. In the normal mode, the switches SW3 to SW5 are closed and other switches are opened, and the power storage elements B(1) to B(n) have their voltages respectively measured by the first to n-th voltage detecting units.

[15] In the first equalization mode, all the switches are controlled as described above so that at least one of the power storage elements B(1) to B(n) is discharged by a first current. In the second equalization mode, all the switches are controlled as described above so that at least one of the power storage elements B(1) to B(n) is discharged by a second current.

That is, the voltage control method according to the present embodiment includes the steps of; (i) individually measuring voltages of the power storage elements B(1) to B(n) by the voltage measuring unit; (ii) setting an equalization target voltage Vm based on the measured values measured by the voltage measuring unit; and (iii) discharging at least one of the power storage elements B(1) to B(n) in the first equalization mode or the second equalization mode based on the equalization target voltage Vm.

[16] In the case where the voltage control apparatus includes the capacitor connected in parallel to the power storage element B(1), the voltages of the power storage elements B(2) to B(n) obtained in the normal mode may be corrected at proper timing. Here, the negative terminal of the power storage element B(1) is connected to the first terminal of the capacitor, and the positive terminal of the power storage element B(1) is connected to the second terminal of the capacitor. Between the terminal T(1) and the first terminal of the capacitor, a sixth switch SW6 is provided. In correcting the voltage, the following steps are executed: (I) opening the switches SW6, SW3, and SW4 and canceling the normal mode, thereafter closing a predetermined switch, to cause the capacitor to read the voltage of a power storage element B(i) (i≠1); (II) after causing the capacitor to read the voltage of the power storage element B(i), opening a predetermined switch; (III) after opening the predetermined switch, closing the switch SW6 and measuring, by the first voltage detecting unit, the voltage of the capacitor having read the voltage of the power storage element B(i); (IV) after measuring the voltage of the capacitor by the first voltage detecting unit, causing the capacitor to discharge; and (V) correcting the measured value measured by an i-th voltage detecting unit based on the measured voltage value of the capacitor measured by the first voltage detecting unit. Note that, the order of executing the steps (IV) and (V) is not specified.

That is, in the normal mode, voltage measurement by the first to n-th voltage detecting units is carried out. At proper timing, control transits to the correction mode, where voltage measurement via the capacitor is carried out. Thus, the measured values obtained by the first to n-th voltage detecting units can be corrected using the measured voltage value of the capacitor at proper timing.

Note that, in causing the capacitor to discharge, for example, the switches SW1(1) and SW4 should be closed. Thereafter, when returning to the normal mode, the switch SW1(1) should be opened and the switch SW3 should be closed. Further, when correction of other power storage element B(j) (j≠2) is subsequently to be performed, the switches SW1(1) and SW4 should be opened and control should return to step (I). Still further, when correction of the power storage element B(2) is subsequently to be performed, the switch SW4 should be opened and control should return to step (I) with the switch SW1(1) maintained in the closed state.

[17] The voltage control method preferably includes, before causing the capacitor to read the voltage of the power storage element B(j) (j≠1), the steps of (a) after closing the switches SW1(1) and SW4, opening the switches SW1(1) and SW4; (b) after step (a), closing the switch SW6 and measuring the voltage of the capacitor by the first voltage detecting unit; (c) comparing the voltage of the capacitor measured in step (b) against a threshold value, and when the voltage of the capacitor is equal to or greater than the threshold value, detecting abnormality of the switch SW3; (d) when the switch SW3 is normal (that is, when abnormality of the switch SW3 is not detected), closing the switch SW3 and measuring the voltage of the capacitor by the first voltage detecting unit; and (e) when the voltage of the capacitor measured in step (d) is equal to or greater than the threshold value, detecting abnormality of the switch SW4. Thus, whether or not the switch SW3 and/or SW4 has been failed can be detected.

Details of Embodiments of the Invention

In the following, a description will be given of embodiments of the present invention with reference to the drawings as appropriate. Note that, the present invention is not limited to those exemplary embodiments. Instead, the present invention is defined by the claims and intended to include any modifications having equivalent meanings to those of the claims and falling within the scope of the claims.

First Embodiment

FIG. 1 is a circuit configuration diagram of an exemplary power supply apparatus including a voltage measuring apparatus according to the present embodiment. In the following, a description will be given of an embodiment of a power supply apparatus that includes a voltage measuring apparatus, and a power storage module including n-pieces (2≤n) of power storage elements B(1) to B(n) connected in series.

A power supply apparatus 100 includes a power storage module 101, a switching circuit (voltage control circuit) 105 connected to the power storage module 101, a module control unit 102 connected to the power storage module 101 via the switching circuit, and an operation processing unit 103 capable of communicating with the power storage module 101 and the module control unit 102.

The power storage module 101 includes n-pieces (2≤n) of power storage elements B(1) to B(n) connected in series. The power storage elements B(1) to B(n) are arranged in order so that potential becomes higher as n increases. Note that, in the drawing, while four power storage elements are illustrated for the sake of convenience, it is to be understood that herein the number of the power storage elements and the number of corresponding components are each n-pieces (2≤n).

The module control unit 102 includes a first voltage measuring unit 11, a second voltage measuring unit (VMS) 12, and a SW control unit (SW-Ct) 13. The first voltage measuring unit 11 includes first to n-th voltage detecting units VS(1) to VS(n) that respectively individually measure voltages of the power storage elements B(1) to B(n). The second voltage measuring unit 12 measures the voltage of the power storage module 101 (that is, the cumulative voltage of the power storage elements B(1) to B(n)). Specifically, the negative terminal of a power storage element B(j) (j is an integer from 1 to n) is connected to the first terminal (−) of a j-th voltage detecting unit VS(j), and the positive terminal of the power storage element B(j) is connected to the second terminal (+) of the j-th voltage detecting unit VS(j). The first voltage measuring unit 11 (the first to n-th voltage detecting units), the second voltage measuring unit (VMS) 12, and the SW control unit 13 communicate with the operation processing unit 103. The measured values obtained at the voltage measuring units are transmitted to the operation processing unit 103 via communication means 104. The SW control unit 13 controls closing/opening (ON/OFF) of switches according to control instructions from the operation processing unit 103.

The switching circuit 105 includes a capacitor C that is connected between the first terminal (−) and the second terminal (+) of the first voltage detecting unit VS(1). The capacitor C is connected in parallel to the power storage element B(1) in the normal mode. On the other hand, the switching circuit 105 connects, using still another plurality of connection lines, the negative terminals of the power storage elements B(1) to B(n) to the first terminal (−) of the capacitor C via respective corresponding first switches (−), and connects the positive terminals of the power storage elements B(1) to B(n) to the second terminal (+) of the capacitor C via respective corresponding second switches (+). Further, between the first terminal (−) of the capacitor C and the first terminal (−) of the first voltage detecting unit VS(1), a third switch SW3 is interposed. In the drawing, while a fourth switch SW4 is interposed between the second terminal (+) of the capacitor C and the second terminal (+) of the first voltage detecting unit VS(1), the fourth switch SW4 is not essential.

That is, between a line that has the lowest potential and connects the negative terminal of the power storage element B(1) and the first terminal (−) of the first voltage detecting unit VS(1) to each other, and a line that has a higher potential and connects the negative terminal of a power storage element B(j) (j≠1) and the first terminal (−) of a j-th voltage detecting unit VS(j) to each other, a corresponding connection line (a bypass line) is provided. A first switch (−) corresponding to the power storage element B(j) is inserted in the connection line.

Similarly, between a line that has the second lowest potential and connects the positive terminal of the power storage element B(1) and the second terminal of the first voltage detecting unit VS(1) to each other, and a line that has a higher potential and connects the positive terminal of the power storage element B(j) (j≠1) and the second terminal of the j-th voltage detecting unit VS(j) to each other, a corresponding connection line (a bypass line) is provided. A second switch (+) corresponding to the power storage element B(j) is inserted in the connection line.

In the drawing, out of the first switches (−), a switch SW11 is disposed nearest to the negative terminal of the power storage element B(1) in terms of potential. Accordingly, the switch SW11 is always interposed between the negative terminal of the power storage element B(1), and the first switches (−) other than the switch SW11 and the second switches (+). On the other hand, out of the second switches (+), switches SW12 and SW21 are disposed nearest to the positive terminal of the power storage element B(1) in terms of potential. The switches SW12 or SW21 is always interposed between the positive terminal of the power storage element B(1), and the first switches (−) and the second switches (+) other than the switches SW12 and SW21. As shown in the drawing, the switch SW21 is in parallel to the switch SW12.

Note that, in the circuit in the drawing, resistors Rj1 and Rj2 are respectively connected to switches SWj1 and SWj2 (j≠1). When any difference in voltage occurs among the plurality of power storage elements, the resistors Rj1 and Rj2 can serve to consume part of the electric energy of the power storage elements for equalizing the plurality of power storage elements in terms of voltage.

Since the power storage element B(1) and the capacitor C are connected in parallel to each other, in the state where the switches SW11 and SW12 are closed and other switches are open, the voltage between terminals of the capacitor C is basically identical to the voltage of the power storage element B(1). Note that, the state where the switches SW3, SW4, SW11, and SW12 are closed and other switches are open is the normal mode. In the normal mode, the power storage elements B(1) to B(n) have their voltages individually respectively measured by the first to n-th voltage detecting units.

In accordance with the measurement result of the voltages of the power storage elements, the operation processing unit 103 outputs a control instruction for correcting the measured values, or a control instruction for equalizing the voltages.

The operation processing unit 103 may include a calculation unit 14 which is necessary for calculating the equalization target voltage, or may include a charge/discharge control unit 15 that controls charging/discharging of the power storage module 101 (the power storage element B(j)). The operation processing unit 103 may further include a memory unit 16 to store therein calculation formulas and/or measured data necessary for the calculation. The memory unit 16 may be implemented by random access memory (RAM) or read only memory (ROM) storing therein an operation processing program. The calculation unit 14 includes a CPU.

The power storage elements B(1) to B(n) are devices such as capacitors or secondary batteries. The capacitors may be electric double-layer capacitors, lithium-ion capacitors or the like. The secondary batteries may be sodium-ion secondary batteries, lithium-ion secondary batteries, nickel-metal hydride batteries or the like. The type of the first switches and the second switches are not particularly specified, and may be implemented by transistors, FETs, diodes, relay switches or the like.

Figure 2:
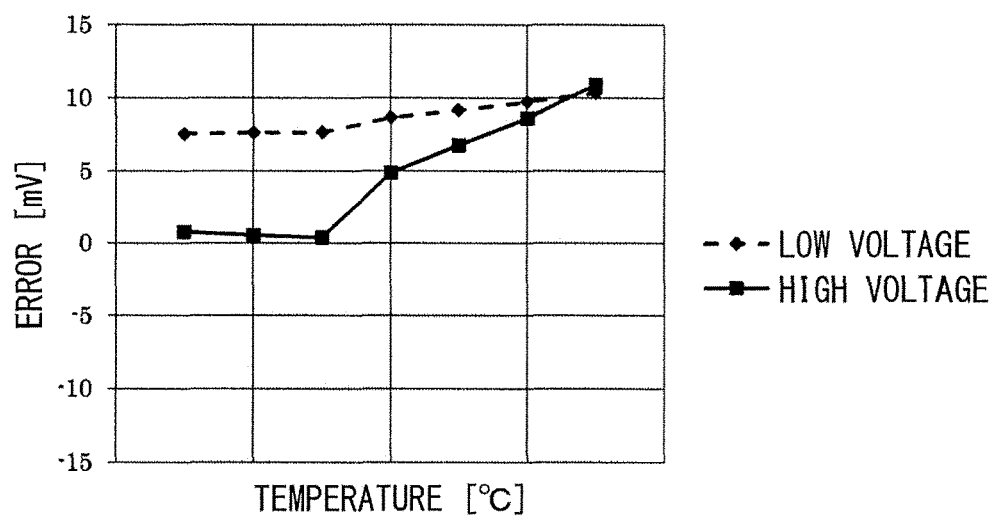
FIG. 2 shows errors in measured values in measuring the voltage of a power storage element on the positive terminal side in a power storage module.

Here, FIG. 2 shows errors in measured values in measuring the voltage of a power storage element B(n) on the positive terminal side of the power storage module 101 with the n-th voltage detecting unit. The solid-line graph shows exemplary errors with the power storage module in the high voltage state, and the broken-line graph shows exemplary errors with the power storage module in the low voltage state. While the errors in the voltage of the power storage element B(n) disposed on the high potential side differ depending on the temperature, such errors are generally great and exceed 10% at a maximum. Most of such errors occur due to intervention of a level shifting circuit.

Figure 3:
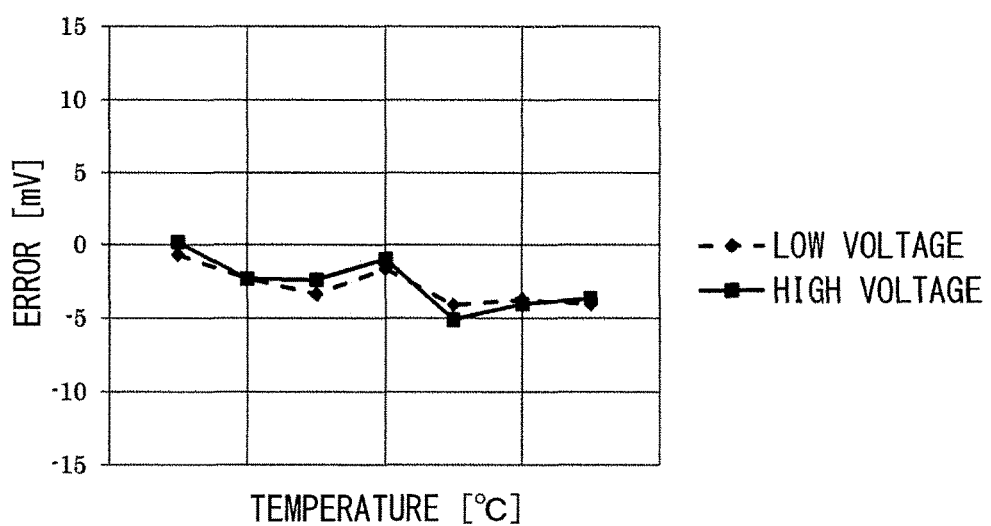
FIG. 3 shows errors in measured values in measuring the voltage of a power storage element on the negative terminal side in the power storage module.

On the other hand, FIG. 3 shows errors in measured values in measuring the voltage of a power storage element B(1) on the negative terminal side of the power storage module 101 with the first voltage detecting unit. Since measuring the voltage of the power storage element B(1) does not require level shifting, errors are generally small irrespective of the magnitude of the voltage, and are less than 5%.

As shown in FIGS. 2 and 3, it is difficult to accurately measure the voltages of the power storage elements on the high potential side (in particular, the power storage element B(n)) by using only the first to n-th voltage detecting units. Accordingly, it is desirable to correct the measured voltage values measured in the normal mode as appropriate.

Figure 4:
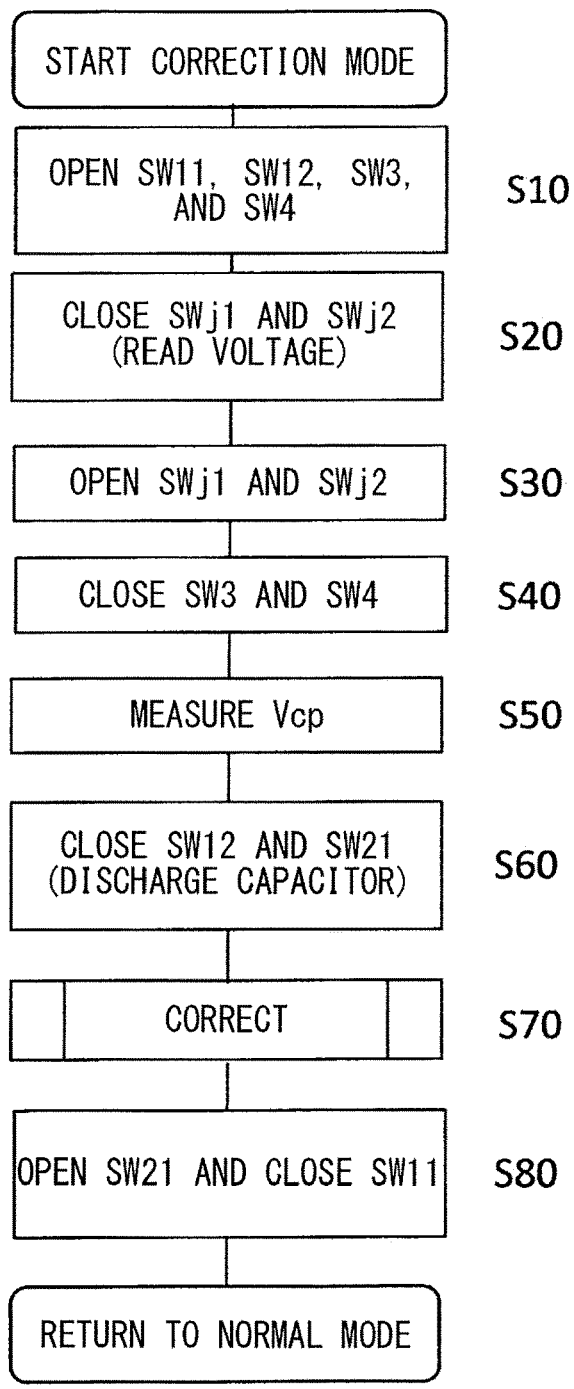
FIG. 4 is a flowchart showing exemplary control in a correction mode in a voltage measuring method according to one embodiment of the present invention.

In the following, with reference to FIG. 4, a description will be given of a voltage measuring method incorporating a correction mode. Note that, the flow in FIG. 4 is merely of an exemplary nature, and the order and number of steps are not limited to those shown in FIG. 4 and the following description.

The voltages of the power storage elements B(1) to B(n) are measured normally in the normal mode. In the normal mode, the voltages of the power storage elements B(1) to B(n) are respectively measured using corresponding first to n-th voltage detecting units. Here, while the switches SW3 and SW4 are in the closed ON state and the switches SW11 and SW12 are also in the closed ON state, other first switches (−) and second switches (+) are in the open OFF state.

In transiting from the normal mode to the correction mode, firstly the switches SW11, SW12, SW3, and SW4 are opened to be in the OFF state (S10). Thereafter, the switches SWj1 and SWj2 (j is an integer selected from 2 to n) are closed to be in the ON state (S20). This j is selected arbitrarily, and the voltage of a power storage element B(j)

corresponding to the value j is the measurement target. Note that, all the switches other than the switches SWj1 and SWj2 are open and in the OFF state. In this state, the power storage element B(j) is connected in parallel to the capacitor C. Thus, the voltage between the first terminal (−) and the second terminal (+) of the capacitor C becomes identical to the voltage of the power storage element B(j), and the capacitor reads the voltage of the power storage element B(j).

Next, the switches SWj1 and SWj2 are opened to be in the OFF state (S30). Thus, while the voltage between terminals of the capacitor C still reflects the voltage of the power storage element B(j), the connection between the capacitor C and the power storage element B(j) having a high potential is canceled. In this state, the switches SW3 and SW4 are closed (S40), and the first voltage detecting unit VS(1) measures a voltage Vcp of the capacitor C that reflects the voltage of the power storage element B(j) (S50).

Next, when the switches SW12 and SW21 are closed to be in the ON state (S60), the terminals of the capacitor C are short-circuited, and the stored electric energy is discharged. Thus, the capacitor C recovers the original state.

Next, the voltage Vj of the power storage element B(j) measured by the j-th voltage detecting unit in the normal mode and the voltage Vcp of the capacitor measured by the first voltage detecting unit are compared against each other. When there exists a substantial difference between them, the measured value Vj in the normal mode is corrected based on the voltage Vcp (S70). While the method of correction is not particularly specified, for example, the stored data for converting the measurement signal obtained at the j-th voltage detecting unit into voltage is reset, so that the difference ΔV between the measured value Vj and the voltage Vcp is added to or subtracted from the future measured value in the normal mode.

When a series of steps ends, the switch SW21 is opened to be in the OFF state and the switch SW11 is closed to be in the ON state. Thus, the normal mode is recovered (S80). Thereafter, using the corrected measured value, charge/discharge control and additionally equalization control are exerted as necessary.

Figure 5:
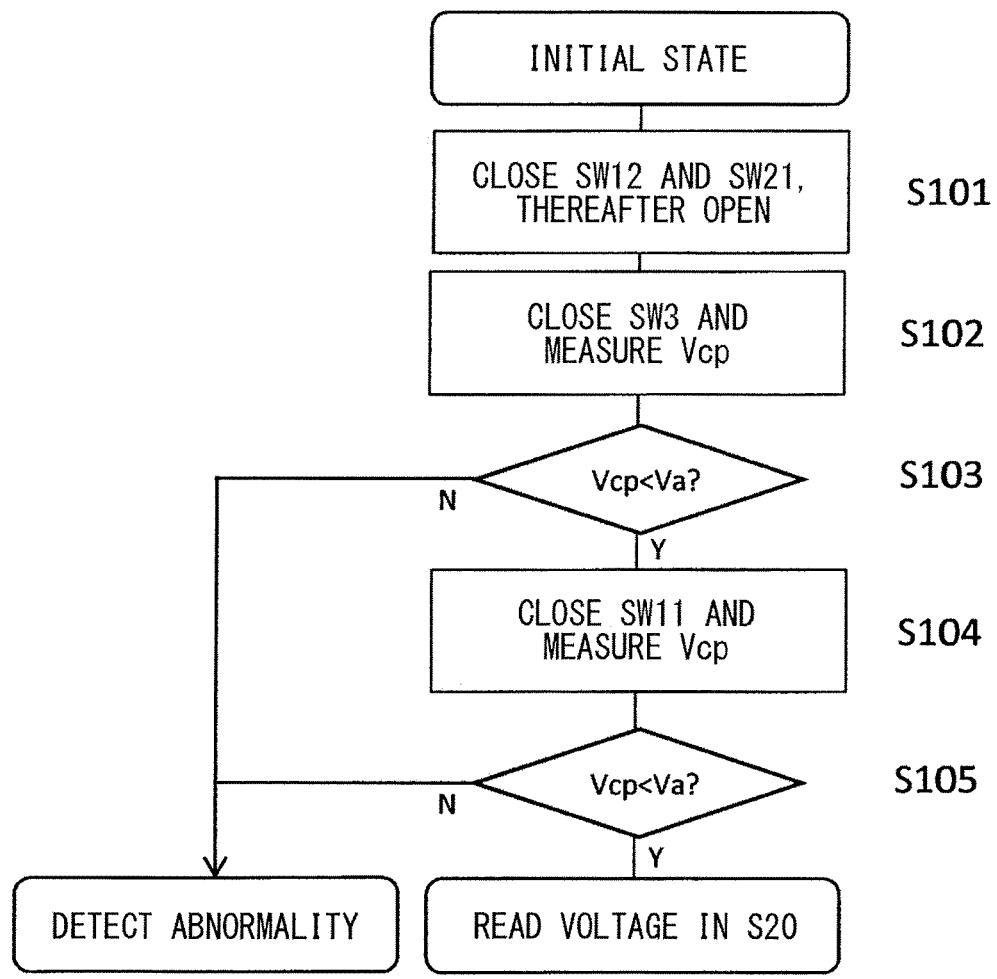
FIG. 5 is a flowchart showing the procedure of checking whether or not any failure has occurred in a switching circuit.

In transiting from the normal mode to the correction mode, before the step (S20) of closing the switches SWj1 and SWj2 (j is an integer selected from 2 to n) and causing the capacitor C to read the voltage of the power storage element B(j), desirably whether or not the switching circuit (herein the switches SW11 and SW12) has been failed is checked. With reference to FIG. 5, an exemplary procedure of the checking will be described.

In the normal mode, the first switches and the second switches that bypass the lines on the high potential side and the lines on the low potential side are all open. Further, in cancelling the normal mode, the switches SW11, SW12, and SW3 are open. This state is the initial state in the procedure of checking occurrence of failure.

Firstly, the SW control unit 13 closes the switches SW12 and SW21, and thereafter opens the switches SW12 and SW21 (S101). Here, when the switch SW11 is normal, the capacitor C is discharged when the switches SW12 and SW21 are closed. On the other hand, when the switch SW11 is fixed in the closed state due to failure, the capacitor C is not discharged even when the switch SW11 is closed.

Next, when the SW control unit 13 closes the switch SW3, the first voltage detecting unit VS(1) measures the voltage Vcp of the capacitor C (S102). Here, when the switch SW11 is normal, the voltage of the discharged capacitor C (for example, the voltage close to 0 V) is detected by the first voltage detecting unit VS(1). On the other hand, when the switch SW11 has been failed, a voltage V1 of the power storage element B(1) is detected.

The operation processing unit 103 compares the voltage Vcp of the capacitor C measured in S102 against a threshold value Va, and detects abnormality of the switch SW11 when the voltage Vcp is equal to or greater than the threshold value Va (S103). By setting the threshold value Va to be smaller than the voltage V1 of the power storage element B(1) previously measured in the normal mode, abnormality (failure) of the switch SW11 is detected when the voltage V1 of the power storage element B(1) is detected. That is, the threshold value Va should be set so as to satisfy 0≤Va≤V1. on the other hand, the threshold value Va is not necessarily set with reference to the actually measured voltage V1, and may be set with reference to the expected lowest voltage of the power storage element B(1).

Next, when the switch SW11 is normal, the switch SW11 is closed by the SW control unit 13, and the voltage Vcp of the capacitor C is again measured by the first voltage detecting unit VS(1) (S104). Here, when the switch SW12 is normal, since the switch SW12 is open, the detected voltage is maintained at the voltage of the discharged capacitor C. On the other hand, when the switch SW12 is fixed in the closed state due to failure, when the switch SW11 is closed, the capacitor C reads the voltage V1 of the power storage element B(1).

The operation processing unit 103 compares the voltage Vcp of the capacitor C measured in S104 against the threshold value Va. The operation processing unit 103 detects abnormality of the switch SW12 when the voltage Vcp of the capacitor C is equal to or greater than the threshold value Va (S105). In this case also, by setting the threshold value Va to be smaller than the voltage V1 of the power storage element B(1), abnormality (failure) of the switch SW11 is detected when the voltage V1 of the power storage element B(1) is detected.

Note that, as the expected lowest voltage of the power storage element B(1), for example, an overdischarge voltage V1' of the power storage element B(1) should be used. All the power storage elements B(j) are normally controlled so as to avoid the overdischarge state. Accordingly, when the voltage lower than the overdischarge voltage V1' of the power storage element B(1) is detected by the first voltage detecting unit VS(1), probability of the capacitor C reading the voltage of the power storage element B(1) is low, and it can be determined that the switches SW11 and SW12 are normal.

Even if the switches SW11 and SW12 are normal, it may take time for the capacitor C to be discharged. On the other hand, in order to quickly determine whether or not failure has been occurred, it is desirable to detect the voltage of the capacitor C at the stage where the capacitor C has not fully been discharged, and to determine whether or not failure has been occurred. In such a case, the threshold value should be set to a maximum possible value within a range not exceeding the overdischarge voltage V1'. That is, the threshold value Va of the voltage should be set so as to satisfy 0≤Va<V1'.

The starting time point of the correction mode is not particularly specified. For example, when the voltage measuring apparatus or a power supply apparatus is activated, control may once start in the normal mode, and thereafter may transit to the correction mode after a lapse of a predetermined period. Then, out of the power storage elements B(2) to B(n), the power storage elements desired to be corrected are successively corrected. Thereafter, control should return to the normal mode. In the case where the voltage measuring apparatus or the power supply apparatus is continuously used over a considerable period, the module control unit 102 and/or the operation processing unit 103 should be configured so that control automatically transits to the correction mode every predetermined period.

Upon activation of the power supply apparatus, the voltage detecting units VS(1) to VS(n) of the first voltage measuring unit 11 measure the present voltages of the power storage elements. The measured values are transmitted from the module control unit 102 to the operation processing unit 103 via the communication means 104. The calculation unit 14 that the operation processing unit 103 includes performs a predetermined operation based on the measured voltage values using the calculation formulas and/or measured data (which are reset in the correction mode at proper timing) stored in the memory unit 16. Then, based on the operation result, the charge/discharge control unit 15 controls charging/discharging of the power storage elements. On the other hand, the module control unit 102 switches between the normal mode and the correction mode via the SW control unit 13 at proper timing.

Second Embodiment

Figure 6:
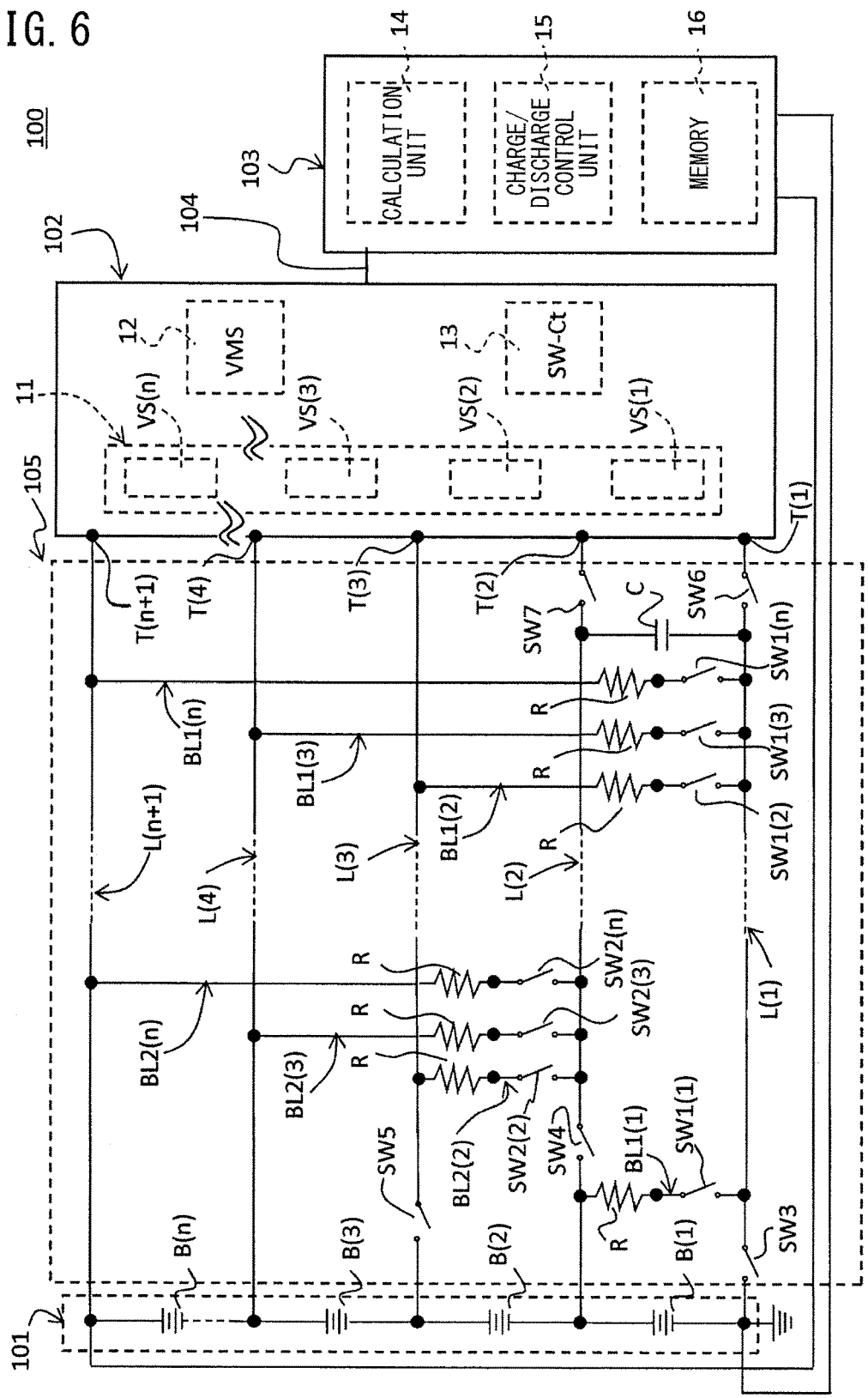
FIG. 6 is a circuit configuration diagram of an exemplary voltage control apparatus (power supply apparatus) according to one embodiment of the present invention.

FIG. 6 is a circuit configuration diagram of an exemplary power supply apparatus that includes a voltage control apparatus according to the present embodiment. A power supply apparatus 100 includes a power storage module 101, a switching circuit 105 connected to the power storage module 101, a module control unit 102 connected to the power storage module 101 via the switching circuit, and an operation processing unit 103 capable of communicating with the power storage module 101 and the module control unit 102.

The power storage module 101 includes n-pieces (2≤n) of power storage elements B(1) to B(n) connected in series. The power storage elements B(1) to B(n) are arranged in order so that potential becomes higher as n increases. Note that, in the drawing, while four power storage elements are illustrated for the sake of convenience, it is to be understood that herein the number of the power storage elements and the number of corresponding components are each n-pieces (2≤n).

The module control unit 102 includes a first voltage measuring unit 11, a second voltage measuring unit (VMS) 12, and a SW control unit (SW-Ct) 13. The first voltage measuring unit 11 includes first to n-th voltage detecting units VS(1) to VS(n) that respectively individually measure voltages of the power storage elements B(1) to B(n). The second voltage measuring unit 12 measures the voltage of the power storage module 101 (that is, the cumulative voltage of the power storage elements B(1) to B(n)). Specifically, the negative terminal of a power storage element B(i) (i is an integer from 1 to n) is connected to the first terminal (−) of an i-th voltage detecting unit VS(i) via a terminal T(i), and the positive terminal of the power storage element B(i) is connected to the second terminal (+) of the i-th voltage detecting unit VS(i) via a terminal T(i+1). The first voltage measuring unit 11 (the first to n-th voltage detecting units), the second voltage measuring unit (VMS) 12, and the SW control unit 13 communicate with the operation processing unit 103. The measured values obtained at the voltage measuring units are transmitted to the operation processing unit 103 via communication means 104. The SW control unit 13 controls closing/opening (ON/OFF) of the switches according to control instructions from the operation processing unit 103.

The switching circuit 105 includes a capacitor C which has its first terminal (−) connected to a terminal T(1) and its second terminal (+) connected to a terminal T(2). That is, the first terminal (−) of the capacitor C is connected to the first terminal (−) of the first voltage detecting unit VS(1), and the second terminal (+) of the capacitor C is connected to the second terminal (+) of the first voltage detecting unit VS(1). Thus, the capacitor C is connected in parallel to the power storage element B(1) in the normal mode.

On the other hand, between a line L(1) that has the lowest potential and connects the negative terminal of the power storage element B(1) and the terminal T(1) (the first terminal (−) of the first voltage detecting unit VS(1)) to each other, and a line that has a higher potential and connects the negative terminal of a power storage elements B(i) (i≠1) and a terminal T(i) (the first terminal (−) of an i-th voltage detecting unit VS(i)) to each other, a corresponding bypass line BL1(i) is provided. A first switch SW1(i) corresponding to the power storage element B(i) is inserted in the bypass line BL1(i).

Similarly, between a line L(2) that has the second lowest potential and connects the positive terminal of the power storage element B(1) and the terminal T(2) (the second terminal (+) of the first voltage detecting unit VS(1)) to each other, and a line L(i+1) that has a higher potential and connects the positive terminal of the power storage element B(i) (i≠1) and the terminal T(i+1) (the second terminal (+) of the i-th voltage detecting unit VS(i)) to each other, a corresponding bypass line BL2(i) is provided. A second switch SW2(i) corresponding to the power storage element B(i) is inserted in the bypass line BL2(i).

The line L(1) has a third switch SW3 on the negative terminal side relative to every connection point with the bypass lines BL1(1) to BL1(n). The line L(2) has a fourth switch SW4 between the connection point with the bypass line BL1(1) and every connection point with the bypass lines BL2(2) to BL2(n). The line L(3) has a fifth switch SW5 on the negative terminal side relative to the connection point with the bypass line BL1(2) and the connection point with the bypass line BL2(2). The switch SW1(1) is connected in parallel to the switch SW4.

To the switches SW1(i) and SW2(i), resistors R having a substantially identical resistance value are respectively connected. The resistors R serve to consume part of electric energy of the power storage elements for equalizing the plurality of power storage elements in terms of voltage.

A sixth switch SW6 is interposed between the terminal T(1) and the first terminal of the capacitor. Further, the connection point between the first terminal of the capacitor and the line L(1) is positioned on the terminal T(1) side relative to every connection point between the line L(1) and the bypass lines BL1(1) to BL1(n). Accordingly, when the switch SW6 is opened, not only the connection between the terminal T(1) and the capacitor but also the connection between the terminal T(1) and every bypass line BL1 is disconnected. On the other hand, a seventh switch SW7 is interposed between the terminal T(2) and the second terminal of the capacitor. Further, the connection point between the second terminal of the capacitor and the line L(2) is positioned on the terminal T(2) side relative to every connection point between the line L(2) and the bypass lines BL2(2) to BL2(n). Accordingly, when the switch SW7 is opened, not only the connection between the terminal T(2) and the capacitor but also every connection between the terminal T(2) and the bypass lines BL2 is disconnected.

Note that, while the switching circuit 105 in the drawing includes the seventh switch SW7, the switch SW7 is not essential.

Since the power storage element B(1) and the capacitor C are connected in parallel to each other, in the state where the switches SW3 to SW6 are closed and other switches are open, the voltage between terminals of the capacitor C is basically identical to the voltage of the power storage element B(1). Note that, the state where the switches SW3 to SW6 are closed and other switches are open is the normal mode. In the normal mode, the power storage elements B(1) to B(n) have their voltages individually respectively measured by the first to n-th voltage detecting units.

In accordance with the measurement result of the voltages of the power storage elements, the operation processing unit 103 outputs a control instruction for correcting the measured values, or a control instruction for equalizing the voltage. The operation processing unit 103 may include a calculation unit 14 which is necessary for calculating the equalization target voltage, or may include a charge/discharge control unit 15 that controls charging/discharging of the power storage module 101. The operation processing unit 103 may further include a memory unit 16 to store therein calculation formulas and/or measured data necessary for the calculation. The memory unit 16 may be implemented by random access memory (RAM) or read only memory (ROM) storing therein an operation processing program. The calculation unit 14 includes a CPU.

The power storage elements B(1) to B(n) are devices such as capacitors or secondary batteries. The capacitors may be electric double-layer capacitors, lithium-ion capacitors or the like. The secondary batteries may be sodium-ion secondary batteries, lithium-ion secondary batteries, nickel-metal hydride batteries or the like. The type of the first to fifth switches are not particularly specified, and may be implemented by transistors, FETs, diodes, relay switches or the like.

Figure 7:
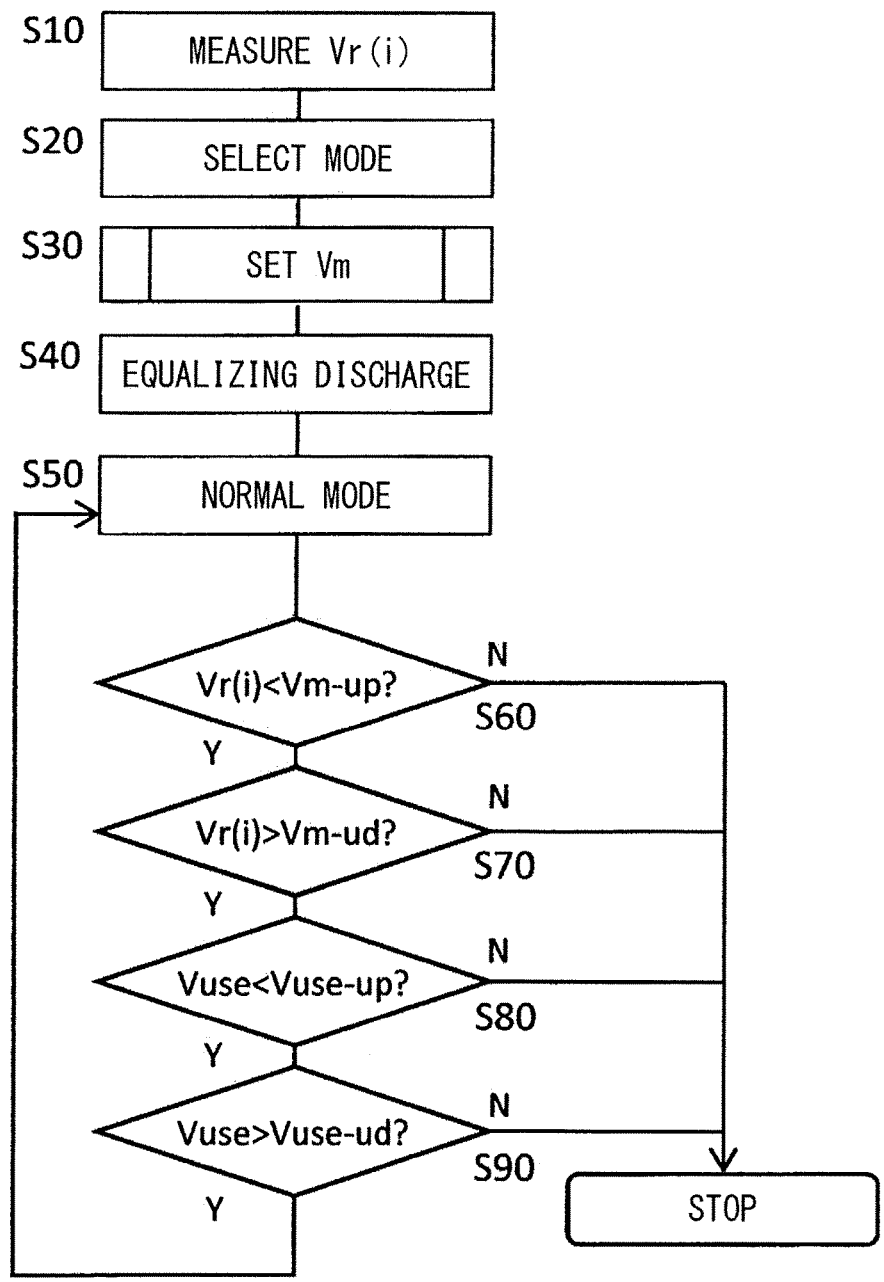
FIG. 7 is a flowchart showing an exemplary voltage control method according to one embodiment of the present invention.

Next, with reference to FIG. 7, a description will be given of an exemplary voltage control method according to the present embodiment. Note that, the flow in FIG. 7 is merely of an exemplary nature, and the order and number of steps are not limited to those shown in FIG. 7 and the following description.

The starting time point of the voltage control method is not particularly specified. For example, the voltage control method may be started upon activation of the power supply apparatus or the voltage control apparatus. When the power supply apparatus or the voltage control apparatus is activated, for example, control may once start in the normal mode, and thereafter may transit to the first or second equalization mode or the correction mode after a lapse of a predetermined period. In the case where the power supply apparatus or the voltage control apparatus is continuously used over a considerable period, the module control unit 102 and/or the operation processing unit 103 should be configured so that control automatically transits to the first or second equalization mode or the correction mode every predetermined period.

In the normal mode, the first voltage detecting unit VS(1) to n-th voltage detecting unit VS(n) of the first voltage measuring unit 11 measure present voltages Vr(i) (i is an integer from 1 to n) of the power storage elements (S10). The measured present voltages Vr(i) are transmitted from the module control unit 102 to the operation processing unit 103 via the communication means 104.

The calculation unit 14 that the operation processing unit 103 includes performs a predetermined operation based on the measured voltage values using the calculation formulas and/or measured data stored in the memory unit 16. Based on the operation result, the charge/discharge control unit 15 controls charging/discharging of the power storage module 101. In other operation, the calculation unit 14 selects one of a plurality of candidate modes. For example, out of the normal mode, the correction mode, the first equalization mode, and the second equalization mode, one mode is selected depending on the situation. Here, when voltage equalization is to be performed, the first equalization mode or the second equalization mode is selected (S20).

When it is desired to quickly attain equalization with a great current value, the first equalization mode is selected. On the other hand, when time is not demanding and it is desired to attain equalization under moderate conditions, the second equalization mode is selected. Here, in which one of the first equalization mode and the second equalization mode discharging is to be performed may be determined individually for each power storage element.

When the first equalization mode or the second equalization mode is selected, in the calculation unit 14, the equalization target voltage Vm is set based on the measured values measured by the first voltage measuring unit 11 (S30). The equalization target voltage Vm is set to a proper value at proper timing, depending on the intended use or manner of use of the power storage module 101. For example, the equalization target voltage Vm is set to the lowest voltage out of the measured voltages Vr(1) to Vr(n). In this case, normally, equalization can be attained by an operation of discharging the power storage elements other than the power storage element B(base) with the lowest voltage.

Next, the module control unit 102 switches any required switch for realizing the selected mode, via the SW control unit 13. Thus, in the first or second equalization mode, discharging for equalization is performed (S40). Here, the (n−1) pieces of power storage elements other than the power storage element B(base) are individually discharged as necessary, whereby the voltages of the power storage elements approximate the equalization target voltage Vm.

On the other hand, when the normal mode is selected, the switches SW3 to SW7 are closed and other switches are maintained to be open. When the correction mode is selected, for example, according to the flow described later (see FIG. 8), correction of the voltages of the power storage elements is successively performed.

When the first equalization mode is selected, all the switches are controlled so that at least one of the power storage elements B(1) to B(n) is discharged by the first current. When the second equalization mode is selected, all the switches are controlled so that at least one of the power storage elements B(1) to B(n) is discharged by the second current. The circuit through which the first current flows is configured so as to have resistance corresponding to one piece of resistor R. The circuit through which the second current flow is configured so as to have resistance corresponding to two pieces of resistors R.

In causing the power storage element B(1) to discharge in the first equalization mode, the SW control unit 13 closes the switches SW1(1) and SW3, and opens other switches. In causing the power storage element B(1) to discharge in the second equalization mode, the SW control unit 13 closes the switches SW3, SW4, SW1(2), and SW2(2), and opens other switches.

In causing the power storage element B(2) to discharge in the first equalization mode, the SW control unit 13 closes the switches SW4, SW5, and SW2(2), and opens other switches.

In causing the power storage element B(2) to discharge in the second equalization mode, the SW control unit 13 closes the switches SW5, SW1(1), and SW1(2), and opens other switches.

In causing a power storage element B(i) (i is an integer from 3 to n) to discharge in the first equalization mode, the SW control unit 13 closes the switches SW1(i−1), SW1(i), SW2(i), and SW2(i−1), and opens other switches. In causing the power storage element B(i) to discharge in the second equalization mode, the SW control unit 13 closes the switches SW1(i−1) and SW1(i) or the switches SW2(i) and SW2(i−1), and opens other switches.

When the equalization mode ends, the relevant switches are switched by the SW control unit 13, and the voltage control apparatus 100 transits to the normal mode (S50). In the normal mode, the voltages Vr(1) to Vr(n) of the power storage elements B(1) to B(n) are measured every predetermined time.

The voltages Vr(1) to Vr(n) are compared against an operation-guaranteed upper limit voltage Vm-up (S60). When Vr<Vm-up (Y), the charging continues, and next the voltage Vr is compared against an operation-guaranteed lower limit voltage Vm-ud (S70). When Vr>Vm-ud (Y), the discharging continues. On the other hand, in S60, when Vr≥Vm-up (N), the charging is stopped if in the charging mode. In S70, when Vr≤Vm-ud (N), the discharging is stopped if in the discharging mode. This comparison is performed as to all the power storage elements B(1) to B(n). Accordingly, when any one of the voltages Vr(1) to Vr(n) corresponds to Vr≥Vm-up or Vr≤Vm-ud, the charging is stopped if in the charging mode, and the discharging is stopped if in the discharging mode.

On the other hand, the second voltage measuring unit 12 measures a voltage Vuse of the power storage module 101 every predetermined time, and compares the voltage Vuse against the use upper limit voltage Vuse-up (S80). When Vuse<Vuse-up (Y), the charging continues. Next, the voltage Vuse is compared against the use lower limit voltage Vuse-ud (S90). When Vuse>Vuse-ud (Y), the discharging continues. When Vuse≥Vuse-up or Vuse≤Vuse-ud, the charging is stopped if in the charging mode, and the discharging is stopped if in the discharging mode.

Next, a description will be given of the correction mode. Again, FIGS. 2 and 3 are referred to herein. As shown in FIG. 2, while the errors in the voltage of the power storage element B(n) disposed on the high potential side differ depending on the temperature, such errors are generally great and exceed 10% at a maximum. Most of such errors occur due to intervention of a level shifting circuit. As shown in FIG. 3, since measuring the voltage of the power storage element B(1) does not require level shifting, errors are generally small irrespective of the magnitude of the voltage, and are less than 5%.

As shown in FIGS. 2 and 3, it is difficult to accurately measure the voltages of the power storage elements on the high potential side (in particular, the power storage element B(n)) by using only the first to n-th voltage detecting units. Accordingly, it is desirable to correct the measured voltage values measured in the normal mode as appropriate.

Figure 8:
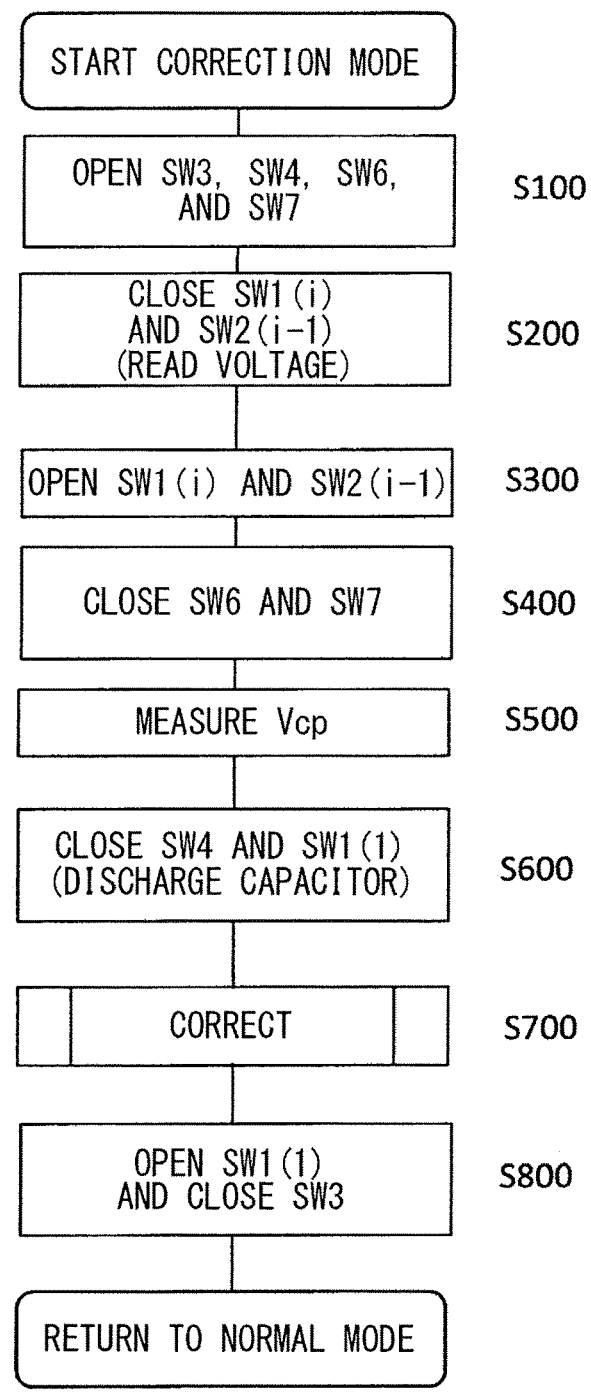
FIG. 8 is a flowchart showing exemplary control in a correction mode in the voltage control method according to one embodiment of the present invention.

In the following, with reference to FIG. 8, a description will be given of a voltage measuring method incorporating a correction mode. Note that, the flow in FIG. 8 is merely of an exemplary nature, and the order and number of steps are not limited to those shown in FIG. 8 and the following description.

The voltages of the power storage elements B(1) to B(n) are measured normally in the normal mode. Here, while the switches SW3 to SW7 are in the closed ON state, other switches are in the open OFF state. In transiting from the normal mode to the correction mode, firstly, the switches SW3, SW4, SW6, and SW7 are opened to be in the OFF state (S100). Thereafter, for example, the switches SW1(i) and SW2(i−1) (i≠1) are closed to be in the ON state (S200). This i is selected arbitrarily, and the voltage of a power storage element B(i) corresponding to the value i is the measurement target. In this state, the power storage element B(i) is connected in parallel to the capacitor C. Thus, the voltage between the first terminal (−) and the second terminal (+) of the capacitor C becomes identical to the voltage of the power storage element B(i), and the capacitor C reads the voltage of the power storage element B(i).

Here, before allowing the capacitor C to read the voltage of the power storage element B(j) (j≠1), it is desirable to check whether or not the switches SW3 and SW4 have been failed. That is, it is desirable to sequentially perform the steps of; (a) after closing the switches SW1(1) and SW4, opening the switches SW1(1) and SW4; (b) after step (a), closing the switch SW6 and measuring the voltage Vcp of the capacitor C by the first voltage detecting unit VS(1); (c) comparing the voltage Vcp of the capacitor C measured in step (b) against a threshold value Va, and detecting abnormality of the switch SW3 when the voltage Vcp is equal to or greater than the threshold value Va; (d) when the switch SW3 is normal, closing the switch SW3 and measuring the voltage Vcp of the capacitor C by the first voltage detecting unit VS(1); and (e) when the voltage Vcp of the capacitor C measured in step (d) is equal to or greater than the threshold value Va, detecting abnormality of the switch SW4. While the names of the switches are different, the foregoing procedure is similar to the procedure according to the first embodiment shown in FIG. 5. The manner of setting the threshold value Va may be identical to that in the first embodiment.

When the switches SW3 and SW4 are normal, after causing the capacitor C to read the voltage of the power storage element B(j) (j≠1), the switches SW1(i) and SW2 (i−1) are opened to be in the OFF state (S300). Thus, while the voltage between terminals of the capacitor C still reflects the voltage of the power storage element B(i), the connection between the capacitor C and the power storage element B(i) having a high potential is canceled. In this state, the switches SW6 and SW7 are closed (S400), and the first voltage detecting unit VS(1) measures the voltage Vcp of the capacitor C that reflects the voltage of the power storage element B(i) (S500).

Next, when the switches SW4 and SW1(1) are closed to be in the ON state (S600), the terminals of the capacitor C are short-circuited, and the stored electric energy is discharged. Thus, the capacitor C recovers the original state.

Next, in the normal mode, the voltage Vi of the power storage element B(i) measured by the i-th voltage detecting unit and the voltage Vcp of the capacitor measured by the first voltage detecting unit are compared against each other. When there exists a substantial difference between them, the measured value Vi in the normal mode is corrected based on the voltage Vcp (S700). While the method of correction is not particularly specified, for example, the stored data for converting the measurement signal obtained at the i-th voltage detecting unit into voltage is reset, so that the difference ΔV between the measured voltage Vi and the voltage Vcp is added to or subtracted from the future measured value in the normal mode.

When a series of steps ends, the switch SW1(1) is opened to be in the OFF state and the switch SW3 is closed to be in the ON state. Thus, the normal mode is recovered (S800). Thereafter, using the corrected measured value, charge/discharge control and voltage equalization are performed.

APPENDIXES

As to the above-described voltage measuring apparatus, the following appendixes are disclosed.

APPENDIX 1

A voltage measuring apparatus including:
a voltage measuring unit that includes first to n-th voltage detecting units that respectively individually measure voltages of n-pieces (2≤n) of power storage elements B(1) to B(n) connected in series;
a switching circuit that switches a connection state between the power storage elements B(1) to B(n) and the first to n-th voltage detecting units;
a SW control unit that drives the switching circuit; and
an operation processing unit that communicates with the first to n-th voltage detecting units and the SW control unit, wherein
the power storage elements B(1) to B(n) are arranged in order so that potential becomes higher as n increases,
the voltage measuring unit includes terminals T(1) to T(n) for receiving potential at negative terminals of the power storage elements B(1) to B(n), and a terminal T(n+1) for receiving potential at a positive terminal of the power storage element B(n),
the switching circuit includes
a capacitor connected in parallel to the power storage element B(1),
lines L(1) to L(n+1) that respectively connect the negative terminals of the power storage elements B(1) to B(n) and the positive terminals of the power storage element B(n) to the terminals T(1) to T(n+1),
bypass lines BL1(1) to BL1(n−1) that respectively connect the line L(1) to the lines L(2) to L(n), and
bypass lines BL2(2) to BL2(n) that respectively connect the line L(2) to the line L(3) to L(n+1), wherein
the bypass lines BL1(1) to BL1(n−1) respectively have first switches SW1(1) to SW1(n−1), resistors R being respectively connected in series to the first switches SW1(1) to SW1(n−1),
the bypass lines BL2(2) to BL2(n) respectively have second switches SW2(2) to SW2(n), resistors R being respectively connected in series to the second switches SW2(2) to SW2(n),
the line L(1) has a third switch SW3 on the negative terminal side relative to every connection point with the power storage elements BL1(1) to BL1(n),
the line L(2) has a fourth switch SW4 between a connection point with the bypass line BL1(1) and every connection point with the bypass lines BL2(2) to BL2(n),
a sixth switch SW6 is interposed between the terminal T(1) and the first terminal of the capacitor,
when the first switch interposed between a negative terminal of the power storage element B(j) (j is an integer selected from 2 to n) and the line L(1) is a switch SW1(j−1) and the second switch interposed between a positive terminal of the power storage element B(j) (j is an integer selected from 2 to n) and the line L(2) is a switch SW2(j), the SW control unit closes the switches SW1(j−1) and SW2(j) and opens other ones of the first switches and the second switches according to an instruction from the operation processing unit, so that the capacitor is connected in parallel to the power storage element B(j).

APPENDIX 2

The voltage measuring apparatus according to appendix 1, having a function of sequentially performing operations in which:
(i) the SW control unit closes the switches SW6, SW3 and SW4 and opens the first switch and the second switch, so as to set the switching circuit in a normal mode, and the first to n-th voltage detecting units measure the voltages of the power storage elements B(1) to B(n) in the normal mode;
(ii) the SW control unit opens the switches SW3 and SW4 so as to cancel the normal mode, the SW control unit opening the switch SW6 and thereafter closing the switches SW1(j−1) and SW2(j) (j is an integer selected from 2 to n), to cause the capacitor to read the voltage of the power storage element B(j);
(iii) after causing the capacitor to read the voltage of the power storage element B(j), the SW control unit opens the switches SW1(j−1) and SW2(j);
(iv) after opening the switches SW1(j−1) and SW2(j), the SW control unit closes the switch SW6, and the first voltage detecting unit measures a voltage of the capacitor having read the voltage of the power storage element B(j);
(v) after the first voltage detecting unit has measured the voltage of the capacitor, the SW control unit closes the switches SW4 and SW1(1) so as to discharge the capacitor; and
(vi) the operation processing unit corrects a measured value measured by the j-th voltage detecting unit based on the measured voltage value of the capacitor measured by the first voltage detecting unit.

REFERENCE SIGNS LIST

100: POWER SUPPLY APPARATUS
101: POWER STORAGE MODULE
102: MODULE CONTROL UNIT
103: OPERATION PROCESSING UNIT
104: COMMUNICATION MEANS
105: SWITCHING CIRCUIT
11: FIRST VOLTAGE MEASURING UNIT
12: SECOND VOLTAGE MEASURING UNIT
13: SW CONTROL UNIT
14: CALCULATION UNIT
15: CHARGE/DISCHARGE CONTROL UNIT
16: MEMORY UNIT
B(1) to B(n): POWER STORAGE ELEMENT
C: CAPACITOR
L(1) to L(n): LINE
BL1(1) to BL1(n): BYPASS LINE
BL2(1) to BL2(n): BYPASS LINE
R21 to Rn1: RESISTOR
R22 to Rn2: RESISTOR
R: RESISTOR
SW11 to SWn1: FIRST SWITCH
SW12 to SWn2: SECOND SWITCH
SW1(1) to SW1(n): FIRST SWITCH
SW2(1) to SW2(n): SECOND SWITCH
SW3: THIRD SWITCH
SW4: FOURTH SWITCH
SW5: FIFTH SWITCH
SW6: SIXTH SWITCH
SW7: SEVENTH SWITCH

T(1) to T(n): TERMINAL
VS(1) to VS(n): FIRST TO n-TH VOLTAGE DETECTING UNITS
Va: THRESHOLD VALUE
Vcp: VOLTAGE OF CAPACITOR
Vm: EQUALIZATION TARGET VOLTAGE
Vm-up: OPERATION-GUARANTEED UPPER LIMIT VOLTAGE
Vm-ud: OPERATION-GUARANTEED LOWER LIMIT VOLTAGE
Vr(i): PRESENT VOLTAGE
Vuse: VOLTAGE OF POWER STORAGE MODULE
Vuse-ud: USE LOWER LIMIT VOLTAGE
Vuse-up: USE UPPER LIMIT VOLTAGE

The invention claimed is:

1. A voltage measuring apparatus individually measuring voltages of n-pieces (2≤n) of power storage elements B(1) to B(n) connected in series, the voltage measuring apparatus comprising:
   first to n-th voltage detecting units respectively individually measuring voltages of the power storage elements B(1) to B(n);
   a switching circuit that switches a connection state between the power storage elements B(1) to B(n) and the first to n-th voltage detecting units;
   a SW control unit that drives the switching circuit; and
   an operation processing unit that communicates with the first to n-th voltage detecting units and the SW control unit, wherein
   the power storage elements B(1) to B(n) are arranged in order so that potential becomes higher as n increases,
   the switching circuit includes a capacitor connected in parallel to the power storage element B(1), wherein, in the switching circuit,
   negative terminals of the power storage elements B(1) to B(n) are connected to a first terminal of the capacitor via respective corresponding first switches,
   positive terminals of the power storage elements B(1) to B(n) are connected to a second terminal of the capacitor via respective corresponding second switches,
   a third switch SW3 is interposed between the first voltage detecting unit and the first terminal of the capacitor,
   when the first switch and the second switch corresponding to the power storage element B(j) (j is an integer selected from 1 to n) are respectively switches SWj1 and SWj2,
   according to an instruction of the operation processing unit, the SW control unit closes the switches SWj1 and SWj2 and opens other ones of the first switches and the second switches, so that the capacitor is connected in parallel to the power storage element B(j), the voltage measuring apparatus having a function of sequentially performing operations in which:
   (i) the SW control unit closes switches SW3, SW11 and SW12 and opens other ones of the first switches and the second switches, so as to set the switching circuit to a normal mode, and the first to n-th voltage detecting units measure the voltages of the power storage elements B(1) to B(n) in the normal mode;
   (ii) the SW control unit opens the switches SW11 and SW12 so as to cancel the normal mode, the SW control unit opening the switch SW3 and thereafter closing switches SWj1 and SWj2 (j is an integer selected from 2 to n), to cause the capacitor to read the voltage of the power storage element B(j);
   (iii) after causing the capacitor to read the voltage of the power storage element B(j), the SW control unit opens the switches SWj1 and SWj2;
   (iv) after opening the switches SWj1 and SWj2, the SW control unit closes the switch SW3, and the first voltage detecting unit measures the voltage of the capacitor having read the voltage of the power storage element B(j);
   (v) after the first voltage detecting unit has measured the voltage of the capacitor, the SW control unit closes the switches SW12 and SW21 so as to discharge the capacitor; and
   (vi) the operation processing unit corrects a measured value measured by the j-th voltage detecting unit, based on the measured voltage value of the capacitor measured by the first voltage detecting unit.

2. The voltage measuring apparatus according to claim 1 having a function of sequentially performing, before the operation in which the switches SWj1 and SWj2 (j is an integer selected from 2 to n) are closed to cause the capacitor to read the voltage of the power storage element B(j), operations in which:
   (a) after closing the switches SW12 and SW21, the SW control unit opens the switches SW12 and SW21;
   (b) the SW control unit closes the switch SW3, and the first voltage detecting unit measures a voltage of the capacitor;
   (c) the voltage of the capacitor measured in the operation (b) is compared against a threshold value, and when the voltage of the capacitor is equal to or greater than the threshold value, the operation processing unit detects abnormality of the switch SW11;
   (d) when the switch SW11 is normal, the SW control unit closes the switch SW11, and the first voltage detecting unit measures a voltage of the capacitor; and
   (e) the voltage of the capacitor measured in the operation (d) is compared against the threshold value, and when the voltage of the capacitor is equal to or greater than the threshold value, the operation processing unit detects abnormality of the switch SW12.

3. A voltage measuring apparatus individually measuring voltages of n-pieces (2≤n) of power storage elements B(1) to B(n) connected in series, the voltage measuring apparatus comprising:
   first to n-th voltage detecting units respectively individually measuring voltages of the power storage elements B(1) to B(n);
   a switching circuit that switches a connection state between the power storage elements B(1) to B(n) and the first to n-th voltage detecting units;
   a SW control unit that drives the switching circuit; and
   an operation processing unit that communicates with the first to n-th voltage detecting units and the SW control unit, wherein
   the power storage elements B(1) to B(n) are arranged in order so that potential becomes higher as n increases,
   the switching circuit includes a capacitor connected in parallel to the power storage element B(1), wherein, in the switching circuit,
   negative terminals of the power storage elements B(1) to B(n) are connected to a first terminal of the capacitor via respective corresponding first switches,
   positive terminals of the power storage elements B(1) to B(n) are connected to a second terminal of the capacitor via respective corresponding second switches,
   a third switch SW3 is interposed between the first voltage detecting unit and the first terminal of the capacitor, when the first switch and the second switch corresponding to the power storage element B(j) (j is an integer selected from 1 to n) are respectively switches SWj1 and SWj2,
according to an instruction of the operation processing unit, the SW control unit closes the switches SWj1 and SWj2 and opens other ones of the first switches and the second switches, so that the capacitor is connected in parallel to the power storage element B(j), wherein
the switching circuit further includes resistors that are respectively connected in series to the first switches and the second switches other than the switches SW11 and SW12,
the operation processing unit includes
a calculation unit that calculates an equalization target voltage for voltages of the power storage elements B(1) to B(n) based on the measured voltage values of the power storage elements B(1) to B(n), and
a charge/discharge control unit that individually charges or discharges the power storage elements B(1) to B(n) based on the equalization target voltage, and in the discharging, current flows through at least one of the resistors.

4. The voltage measuring apparatus according to claim 1, wherein a fourth switch SW4 that is opened and closed in synchronization with the third switch is interposed between the first voltage detecting unit and the second terminal of the capacitor.

5. A method of individually measuring voltages of the power storage elements B(1) to B(n) using a voltage measuring apparatus, individually measuring voltages of n-pieces (2≤n) of power storage elements B(1) to B(n) connected in series, the voltage measuring apparatus comprising:
first to n-th voltage detecting units respectively individually measuring voltages of the power storage elements B(1) to B(n);
a switching circuit that switches a connection state between the power storage elements B(1) to B(n) and the first to n-th voltage detecting units;
a SW control unit that drives the switching circuit; and
an operation processing unit that communicates with the first to n-th voltage detecting units and the SW control unit, wherein
the power storage elements B(1) to B(n) are arranged in order so that potential becomes higher as n increases,
the switching circuit includes a capacitor connected in parallel to the power storage element B(1), wherein, in the switching circuit,
negative terminals of the power storage elements B(1) to B(n) are connected to a first terminal of the capacitor via respective corresponding first switches,
positive terminals of the power storage elements B(1) to B(n) are connected to a second terminal of the capacitor via respective corresponding second switches,
a third switch SW3 is interposed between the first voltage detecting unit and the first terminal of the capacitor,
when the first switch and the second switch corresponding to the power storage element B(j) (j is an integer selected from 1 to n) are respectively switches SWj1 and SWj2,
according to an instruction of the operation processing unit, the SW control unit closes the switches SWj1 and SWj2 and opens other ones of the first switches and the second switches, so that the capacitor is connected in parallel to the power storage element B(j), the method comprising the steps of:

(i) measuring, by the first to n-th voltage detecting units, voltages of the power storage elements B(1) to B(n) in a normal mode where switches SW3, SW11 and SW12 are closed and other ones of the first switches and the second switches are open;
(ii) opening the switches SW11 and SW12 to cancel the normal mode, and opening the switch SW3, thereafter closing switches SWj1 and SWj2 (j is an integer selected from 2 to n), to cause the capacitor to read a voltage of the power storage element B(j);
(iii) after causing the capacitor to read the voltage of the power storage element B(j), opening the switches SWj1 and SWj2;
(iv) after opening the switches SWj1 and SWj2, closing the switch SW3 and measuring, by the first voltage detecting unit, the voltage of the capacitor having read the voltage of the power storage element B(j);
(v) after measuring the voltage of the capacitor by the first voltage detecting unit, closing the switches SW12 and SW21 so as to discharge the capacitor; and
(vi) correcting a measured value measured by the j-th voltage detecting unit based on the measured voltage value of the capacitor measured by the first voltage detecting unit.

6. The voltage measuring method according to claim 5, further comprising a step of, after the step (v) or (vi), closing the switch SW11 and opening the switch SW21, so as to return to the normal mode.

7. The voltage measuring method according to claim 5, further comprising the steps of, before the step of closing the switches SWj1 and SWj2 (j is an integer selected from 2 to n) to cause the capacitor to read the voltage of the power storage element B(j):
(a) closing the switches SW12 and SW21 and thereafter opening the switches SW12 and SW21;
(b) after the step (a), closing the switch SW3 and measuring a voltage of the capacitor by the first voltage detecting unit;
(c) comparing the voltage of the capacitor measured in the step (b) against a threshold value, and detecting abnormality of the switch SW11 when the voltage of the capacitor is equal to or greater than the threshold value;
(d) when the switch SW11 is normal, closing the switch SW11 and measuring a voltage of the capacitor by the first voltage detecting unit; and
(e) comparing the voltage of the capacitor measured in the step (d) against the threshold value, and detecting abnormality of the switch SW12 when the voltage of the capacitor is equal to or greater than the threshold value.

8. A voltage control apparatus comprising:
a voltage measuring unit that includes first to n-th voltage detecting units that respectively individually measure voltages of n-pieces (2≤n) of power storage elements B(1) to B(n) connected in series;
a switching circuit that switches a connection state between the power storage elements B(1) to B(n) and the first to n-th voltage detecting units;
a SW control unit that drives the switching circuit; and
an operation processing unit that communicates with the first to n-th voltage detecting units and the SW control unit, wherein
the power storage elements B(1) to B(n) are arranged in order so that potential becomes higher as n increases,
the voltage measuring unit includes terminals T(1) to T(n) for receiving potential at negative terminals of the power storage elements B(1) to B(n), and a terminal T(n+1) for receiving potential at a positive terminal of the power storage element B(n), the switching circuit includes:
  lines L(1) to L(n+1) that respectively connect the negative terminals of the power storage elements B(1) to B(n) and the positive terminal of the power storage element B(n) to the terminals T(1) to T(n+1);
  bypass lines BL1(1) to BL1($n$) that respectively connect the line L(1) to the lines L(2) to L(n+1); and
  bypass lines BL2(2) to BL2($n$) that respectively connect the line L(2) to the lines L(3) to L(n+1), wherein
  the bypass lines BL1(1) to BL1($n$) respectively have first switches SW1(1) to SW1($n$), resistors R being respectively connected in series to the first switches SW1(1) to SW1($n$),
  the bypass lines BL2(2) to BL2($n$) respectively have second switches SW2(2) to SW2($n$), resistors R being respectively connected in series to the second switches SW2(2) to SW2($n$),
  the line L(1) has a third switch SW3 on the negative terminal side relative to every connection point with the bypass lines BL1(1) to BL1($n$),
  the line L(2) has a fourth switch SW4 between a connection point with the bypass line BL1(1) and every connection point with the bypass lines BL2(2) to BL2($n$), and
  the line L(3) has a fifth switch SW5 on the negative terminal side relative to a connection point with the bypass line BL1(2) and a connection point with the bypass line BL2(2).

9. A voltage control apparatus, comprising:
a voltage measuring unit that includes first to n-th voltage detecting units that respectively individually measure voltages of n-pieces (2≤n) of power storage elements B(1) to B(n) connected in series;
a switching circuit that switches a connection state between the power storage elements B(1) to B(n) and the first to n-th voltage detecting units;
a SW control unit that drives the switching circuit; and
an operation processing unit that communicates with the first to n-th voltage detecting units and the SW control unit, wherein
the power storage elements B(1) to B(n) are arranged in order so that potential becomes higher as n increases,
the voltage measuring unit includes terminals T(1) to T(n) for receiving potential at negative terminals of the power storage elements B(1) to B(n), and a terminal T(n+1) for receiving potential at a positive terminal of the power storage element B(n),
the switching circuit includes:
  lines L(1) to L(n+1) that respectively connect the negative terminals of the power storage elements B(1) to B(n) and the positive terminal of the power storage element B(n) to the terminals T(1) to T(n+1);
  bypass lines BL1(1) to BL1($n$) that respectively connect the line L(1) to the lines L(2) to L(n+1); and
  bypass lines BL2(2) to BL2($n$) that respectively connect the line L(2) to the lines L(3) to L(n+1), wherein
  the bypass lines BL1(1) to BL1($n$) respectively have first switches SW1(1) to SW1($n$), resistors R being respectively connected in series to the first switches SW1(1) to SW1($n$),
  the bypass lines BL2(2) to BL2($n$) respectively have second switches SW2(2) to SW2($n$), resistors R being respectively connected in series to the second switches SW2(2) to SW2($n$),
  the line L(1) has a third switch SW3 on the negative terminal side relative to every connection point with the bypass lines BL1(1) to BL1($n$),
  the line L(2) has a fourth switch SW4 between a connection point with the bypass line BL1(1) and every connection point with the bypass lines BL2(2) to BL2($n$), and
  the line L(3) has a fifth switch SW5 on the negative terminal side relative to a connection point with the bypass line BL1(2) and a connection point with the bypass line BL2(2), wherein
the SW control unit has a function of setting all the switches to a mode selected out of a plurality of candidate modes,
the plurality of candidate modes include a normal mode, a first equalization mode, and a second equalization mode,
according to an instruction of the operation processing unit,
  in the normal mode, the SW control unit closes the switches SW3 to SW5 and opens other ones of the switches,
  in the first equalization mode, the SW control unit controls all the switches so that at least one of the power storage elements B(1) to B(n) is discharged by a first current,
  in the second equalization mode, the SW control unit controls all the switches so that at least one of the power storage elements B(1) to B(n) is discharged by a second current,
a circuit through which the first current flows includes resistance corresponding to one piece of the resistor R, and
a circuit through which the second current flows includes resistance corresponding to two pieces of the resistors R.

10. The voltage control apparatus according to claim 9, wherein
the operation processing unit includes a calculation unit that calculates an equalization target voltage Vm for voltages of the power storage elements B(1) to B(n) based on the measured voltage values of the power storage elements B(1) to B(n), and
the SW control unit sets at least one of the power storage elements B(1) to B(n) to the first equalization mode or the second equalization mode based on the equalization target voltage Vm.

11. The voltage control apparatus according to claim 9, further comprising a capacitor connected in parallel to the power storage element B(1), wherein
the negative terminal of the power storage element B(1) is connected to a first terminal of the capacitor,
the positive terminal of the power storage element B(1) is connected to a second terminal of the capacitor,
a sixth switch SW6 is interposed between the terminal T(1) and the first terminal of the capacitor,
the plurality of candidate modes include a correction mode,
according to an instruction of the operation processing unit,
  in the correction mode, the SW control unit connects the capacitor in parallel to one of the power storage elements B(2) to B(n),
  a voltage of the capacitor is measured by the first voltage detecting unit, and
  the operation processing unit corrects the measured values measured in the normal mode based on the measured voltage value of the capacitor measured by the first voltage detecting unit.

12. The voltage control apparatus according to claim 11, wherein a seventh switch SW7 that is opened and closed in synchronization with the sixth switch is interposed between the terminal T(2) and the second terminal of the capacitor.

13. A voltage control method that includes a step of equalizing voltages of the power storage elements B(1) to B(n) using the voltage control apparatus comprising:
a voltage measuring unit that includes first to n-th voltage detecting units that respectively individually measure voltages of n-pieces (2≤n) of power storage elements B(1) to B(n) connected in series;
a switching circuit that switches a connection state between the power storage elements B(1) to B(n) and the first to n-th voltage detecting units;
a SW control unit that drives the switching circuit; and
an operation processing unit that communicates with the first to n-th voltage detecting units and the SW control unit, wherein
the power storage elements B(1) to B(n) are arranged in order so that potential becomes higher as n increases,
the voltage measuring unit includes terminals T(1) to T(n) for receiving potential at negative terminals of the power storage elements B(1) to B(n), and a terminal T(n+1) for receiving potential at a positive terminal of the power storage element B(n),
the switching circuit includes:
lines L(1) to L(n+1) that respectively connect the negative terminals of the power storage elements B(1) to B(n) and the positive terminal of the power storage element B(n) to the terminals T(1) to T(n+1);
bypass lines BL1(1) to BL1($n$) that respectively connect the line L(1) to the lines L(2) to L(n+1); and
bypass lines BL2(2) to BL2($n$) that respectively connect the line L(2) to the lines L(3) to L(n+1), wherein
the bypass lines BL1(1) to BL1($n$) respectively have first switches SW1(1) to SW1($n$), resistors R being respectively connected in series to the first switches SW1(1) to SW1($n$),
the bypass lines BL2(2) to BL2($n$) respectively have second switches SW2(2) to SW2($n$), resistors R being respectively connected in series to the second switches SW2(2) to SW2($n$),
the line L(1) has a third switch SW3 on the negative terminal side relative to every connection point with the bypass lines BL1(1) to BL1($n$),
the line L(2) has a fourth switch SW4 between a connection point with the bypass line BL1(1) and every connection point with the bypass lines BL2(2) to BL2($n$), and
the line L(3) has a fifth switch SW5 on the negative terminal side relative to a connection point with the bypass line BL1(2) and a connection point with the bypass line BL2(2), wherein
the SW control unit has a function of setting all the switches to a mode selected out of a plurality of candidate modes,
the plurality of candidate modes include a normal mode, a first equalization mode, and a second equalization mode,
in the normal mode, the switches SW3 to SW5 are closed and other ones of the switches are opened,
in the first equalization mode, all the switches are controlled so that at least one of the power storage elements B(1) to B(n) is discharged by a first current,
in the second equalization mode, all the switches are controlled so that at least one of the power storage elements B(1) to B(n) is discharged by a second current,
a circuit through which the first current flows includes resistance corresponding to one piece of the resistor R,
a circuit through which the second current flows includes resistance corresponding to two pieces of the resistors R, the voltage control method comprising the steps of:
(i) individually measuring voltages of the power storage elements B(1) to B(n) by the voltage measuring unit;
(ii) setting an equalization target voltage Vm based on the measured values measured by the voltage measuring unit; and
(iii) discharging at least one of the power storage elements B(1) to B(n) based on the equalization target voltage Vm in the first equalization mode or the second equalization mode.

14. The voltage control method according to claim 13, wherein
in discharging the power storage element B(1) in the first equalization mode, the switch SW1(1) and the switch SW3 are closed and other ones of the switches are opened,
in discharging the power storage element B(1) in the second equalization mode, the switch SW3, the switch SW4, the switch SW1(2), and the switch SW2(2) are closed and other ones of the switches are opened,
in discharging the power storage element B(2) in the first equalization mode, the switch SW4, the switch SW5 and the switch SW2(2) are closed and other ones of the switches are opened,
in discharging the power storage element B(2) in the second equalization mode, the switch SW5, the switch SW1(1), and the switch SW1(2) are closed and other ones of the switches are opened,
in discharging the power storage element B(i) (i is an integer selected from 3 to n) in the first equalization mode, a switch SW1($i$−1), the switch SW1($i$), a switch SW2($i$), and the switch SW2($i$−1) are closed and other ones of the switches are opened, and
in discharging the power storage element B(i) in the second equalization mode, the switch SW1($i$−1) and the switch SW1($i$) are closed or the switch SW2($i$−1) and the switch SW2($i$) are closed and other ones of the switches are opened.

15. The voltage control method according to claim 13, wherein
the voltage control apparatus further includes a capacitor connected in parallel to the power storage element B(1),
the negative terminal of the power storage element B(1) is connected to a first terminal of the capacitor,
the positive terminal of the power storage element B(1) is connected to a second terminal of the capacitor,
a sixth switch SW6 is interposed between the terminal T(1) and the first terminal of the capacitor,
the voltage control method further comprising a step of correcting voltages of the power storage elements B(2) to B(n) obtained in the normal mode, the step of correcting includes:
(I) opening the switch SW6, the switch SW3 and the switch SW4 to cancel the normal mode, thereafter closing a predetermined one of the switches to cause the capacitor to read a voltage of the power storage element B(j) (j≠1);

(II) after causing the capacitor to read the voltage of the power storage element B(j), opening the predetermined switch;

(III) after opening the predetermined switch, closing the switch SW6 and measuring, by the first voltage detecting unit, a voltage of the capacitor having read the voltage of the power storage element B(j);

(IV) after measuring the voltage of the capacitor by the first voltage detecting unit, causing the capacitor to discharge; and (V) correcting a measured value measured by the j-th voltage detecting unit based on the measured voltage value of the capacitor measured by the first voltage detecting unit.

16. The voltage control method according to claim 15, further comprising, before causing the capacitor to read the voltage of the power storage element B(j) (j #1), the steps of:

(a) after closing the switch SW1(1) and the switch SW4, opening the switches SW1(1) and SW4;

(b) after the step (a), closing the switch SW6 and measuring a voltage of the capacitor by the first voltage detecting unit;

(c) when the voltage of the capacitor measured in the step (b) is equal to or greater than a threshold value, detecting abnormality of the switch SW3;

(d) when the switch SW3 is normal, closing the switch SW3 and measuring a voltage of the capacitor by the first voltage detecting unit; and (e) when the voltage of the capacitor measured in the step (d) is equal to or greater than the threshold value, detecting abnormality of the switch SW4.

17. The voltage control method according to claim 15, wherein a seventh switch SW7 that is opened and closed in synchronization with the sixth switch is interposed between the terminal T(2) and the second terminal of the capacitor.

18. The voltage measuring apparatus according to claim 2, wherein a fourth switch SW4 that is opened and closed in synchronization with the third switch is interposed between the first voltage detecting unit and the second terminal of the capacitor.

19. The voltage measuring apparatus according to claim 3, wherein a fourth switch SW4 that is opened and closed in synchronization with the third switch is interposed between the first voltage detecting unit and the second terminal of the capacitor.

* * * * *